(12) United States Patent
Ong

(10) Patent No.: US 7,133,798 B1
(45) Date of Patent: Nov. 7, 2006

(54) MONITORING SIGNALS BETWEEN TWO INTEGRATED CIRCUIT DEVICES WITHIN A SINGLE PACKAGE

(75) Inventor: Adrian E. Ong, Pleasanton, CA (US)

(73) Assignee: Inapac Technology, Inc., San Jose, CA (US)

( * ) Notice: Subject to any disclaimer, the term of this patent is extended or adjusted under 35 U.S.C. 154(b) by 0 days.

(21) Appl. No.: 10/967,749

(22) Filed: Oct. 18, 2004

(51) Int. Cl.
*G01R 31/00* (2006.01)

(52) U.S. Cl. ..................................... 702/117
(58) Field of Classification Search .................. 702/117
See application file for complete search history.

(56) References Cited

U.S. PATENT DOCUMENTS 6,351,681 B1* 2/2002 Chih et al. .................. 700/121

2004/0150089 A1* 8/2004 Inoue et al. ................. 257/685

\* cited by examiner

*Primary Examiner*—Michael Nghiem
*Assistant Examiner*—Cindy D. Khuu
(74) *Attorney, Agent, or Firm*—Sidley Austin LLP

(57) ABSTRACT

In one embodiment, a method is provided for monitoring signals communicated between a first integrated circuit chip and a second integrated circuit chip within a single packaged semiconductor device, wherein at least some external terminals for the packaged semiconductor device are shared by the first and second integrated circuit chips. The method includes the following: receiving signals from the first integrated circuit chip at a plurality of bond pads on the second integrated circuit chip; selecting a portion of the received signals; and outputting the selected portion of the received signals from the single packaged semiconductor device.

22 Claims, 12 Drawing Sheets

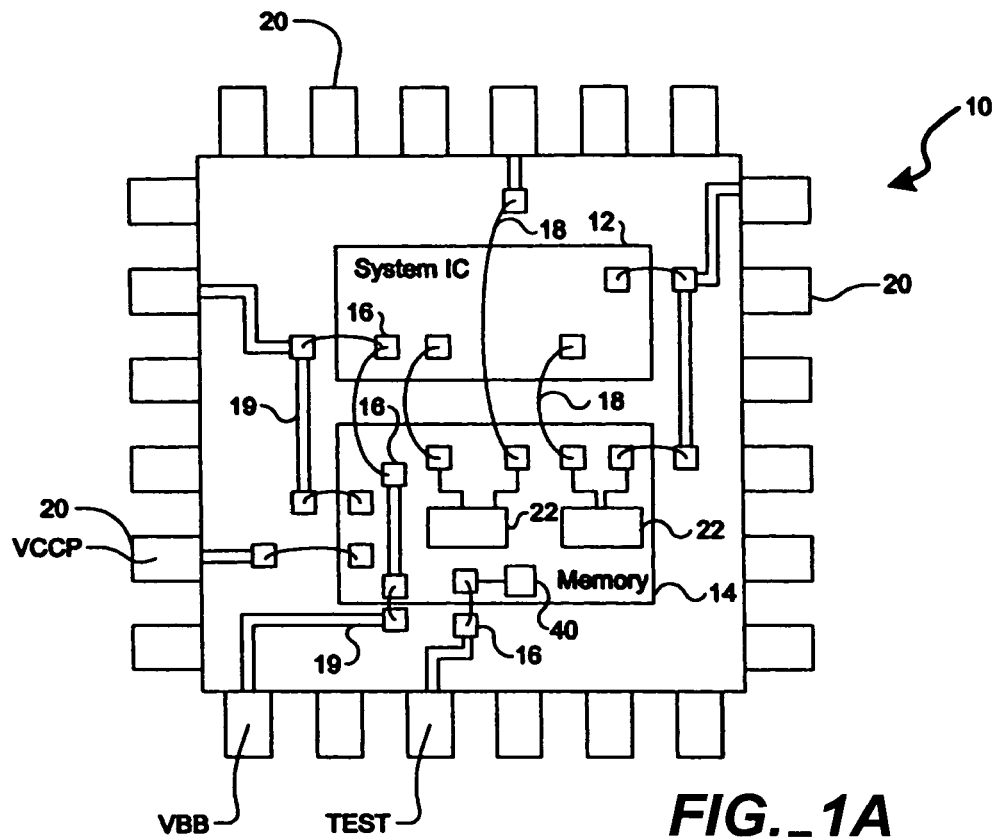
FIG._1A
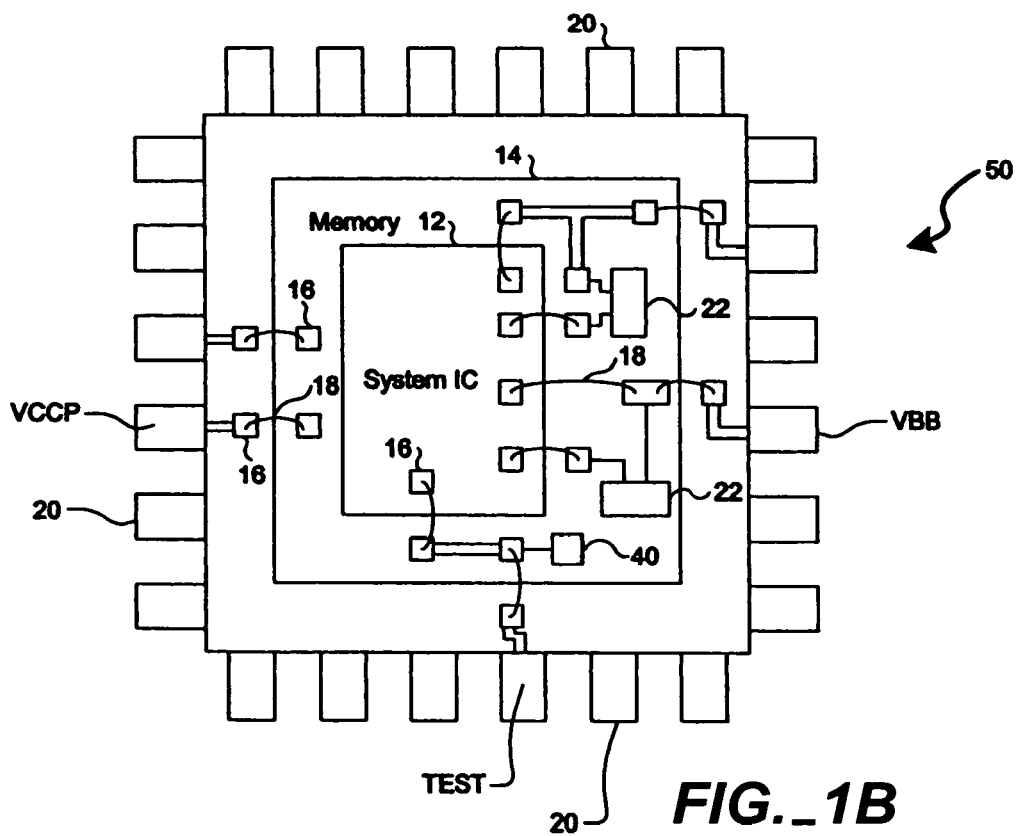
FIG._1B

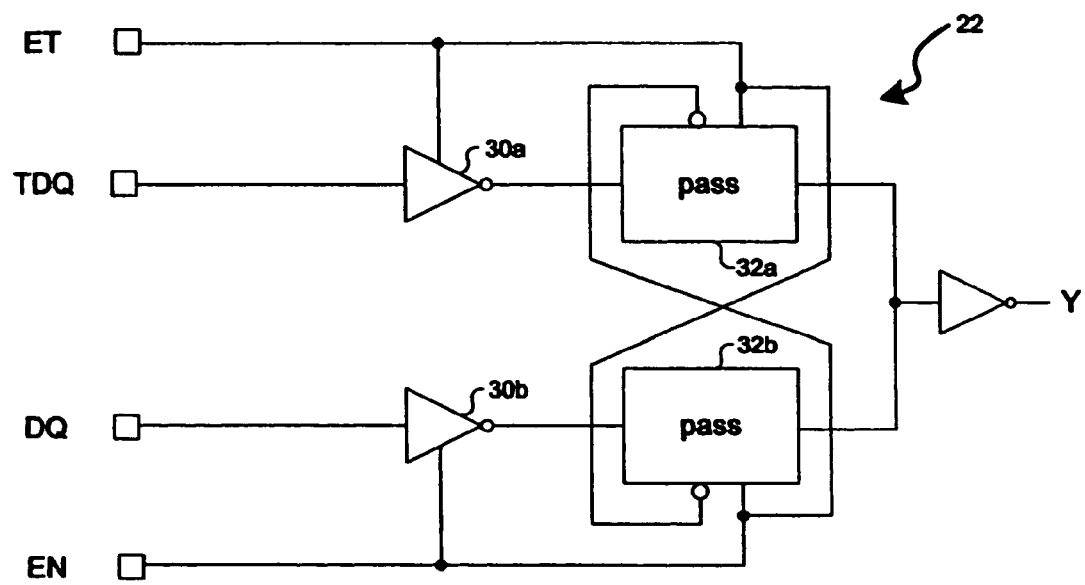
FIG._2A
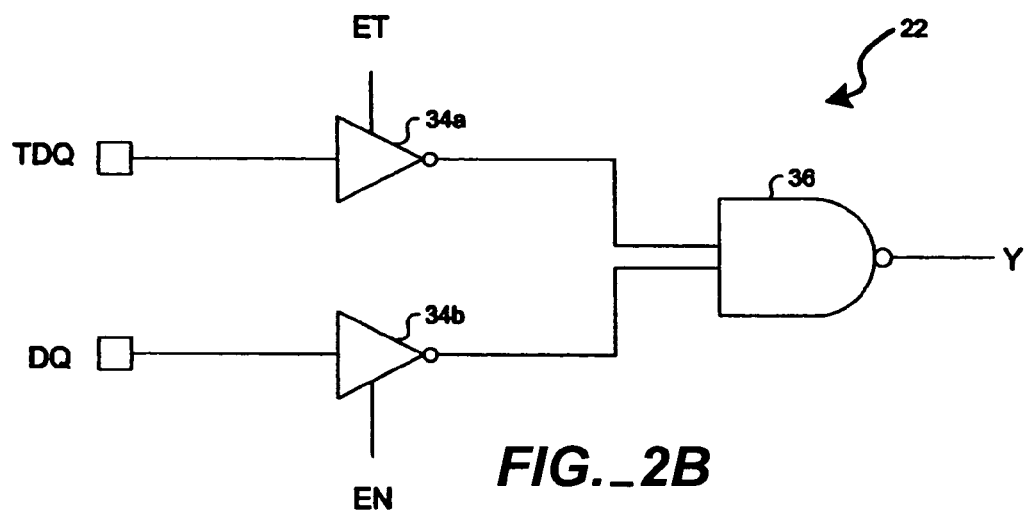
FIG._2B

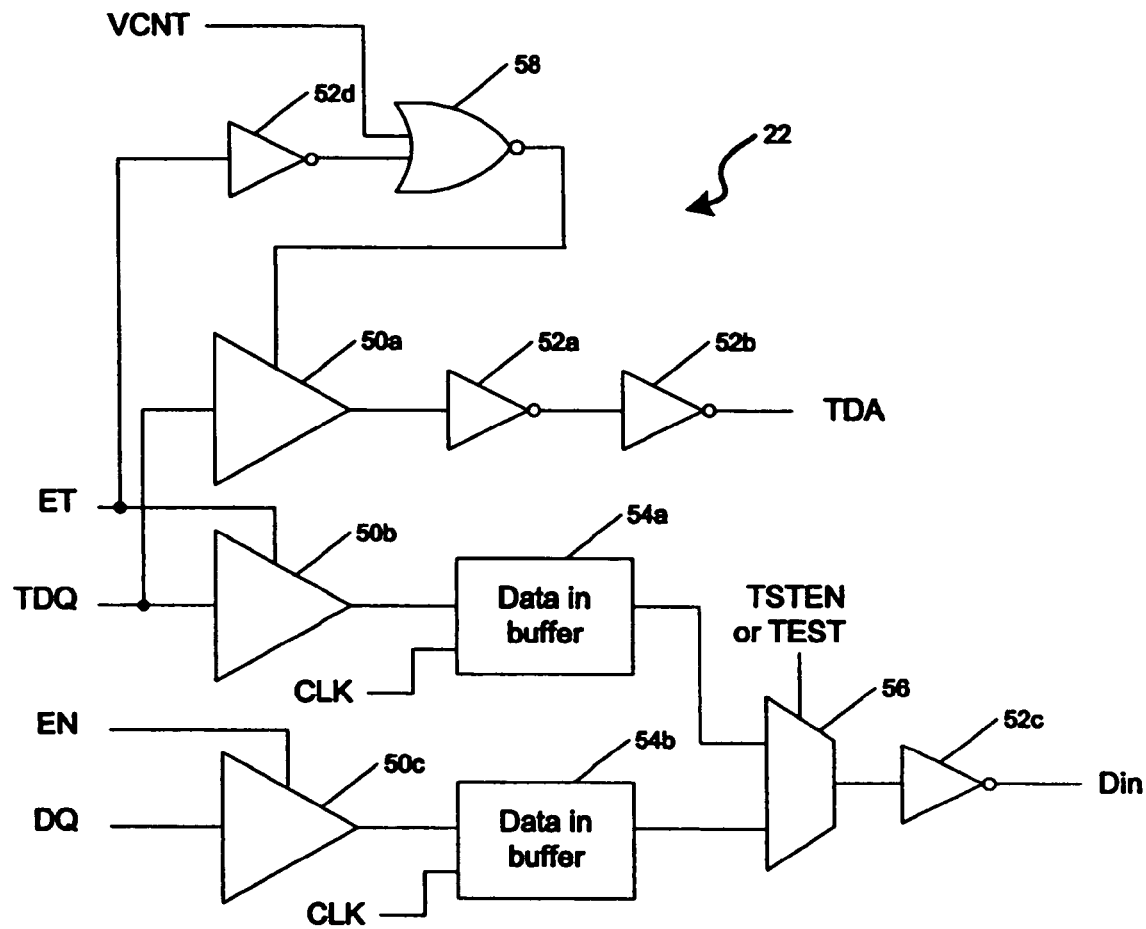
FIG._2C
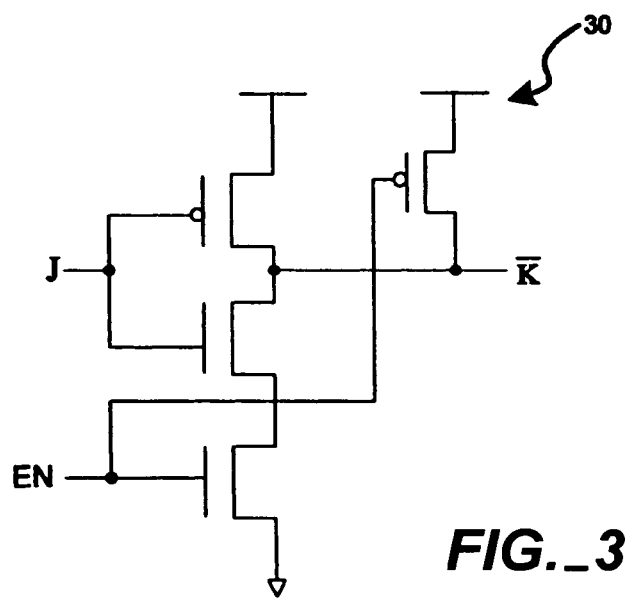
FIG._3

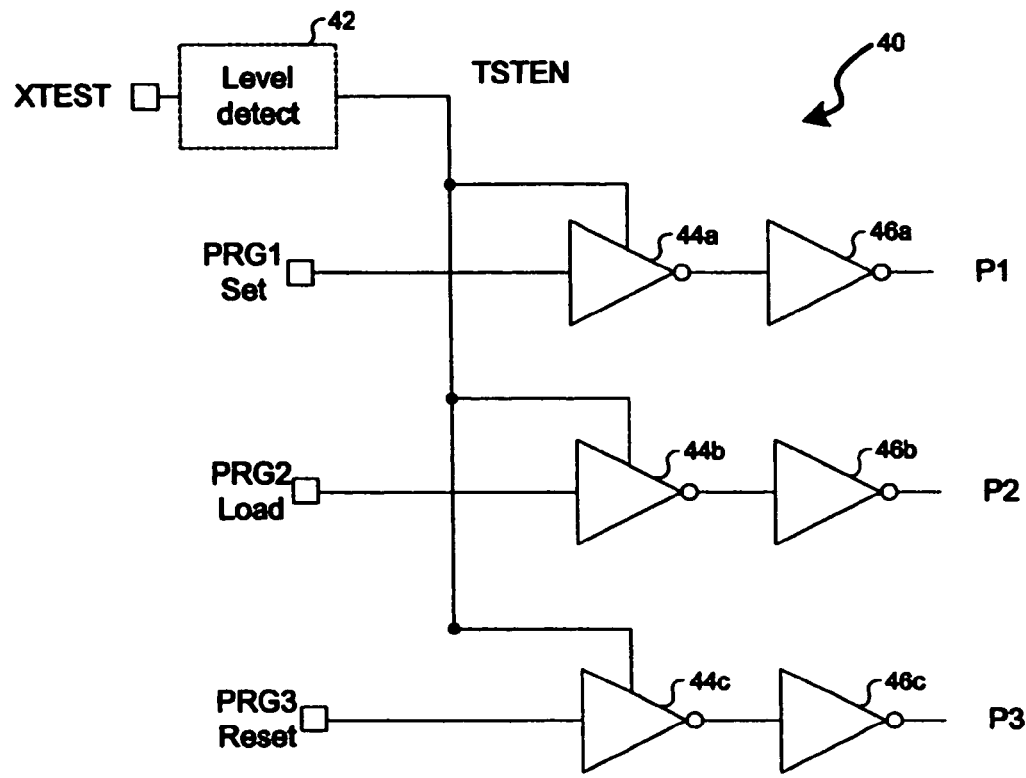
FIG._4
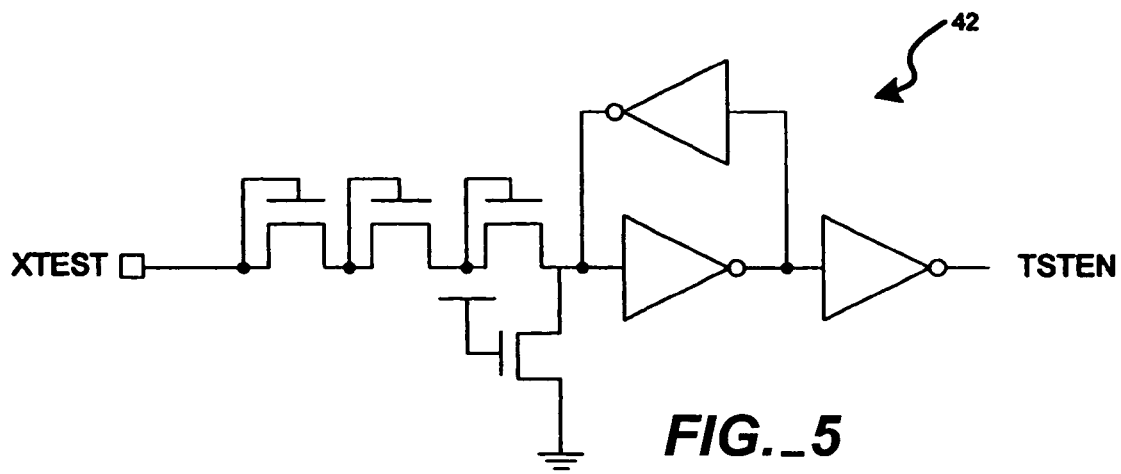
FIG._5

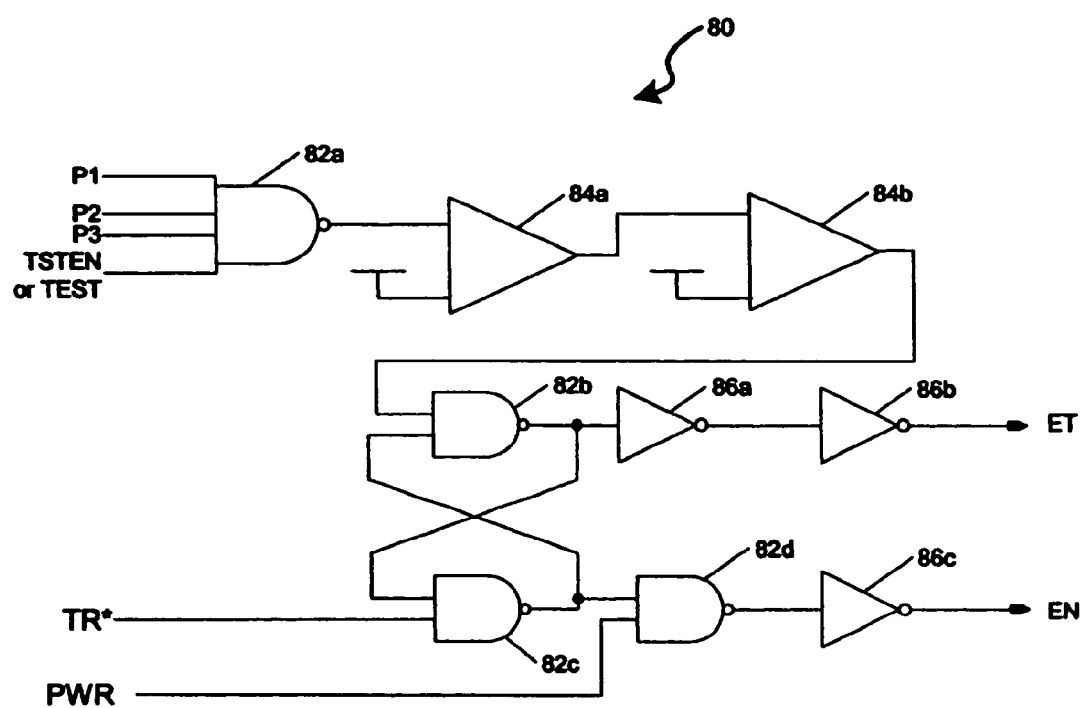
FIG._6

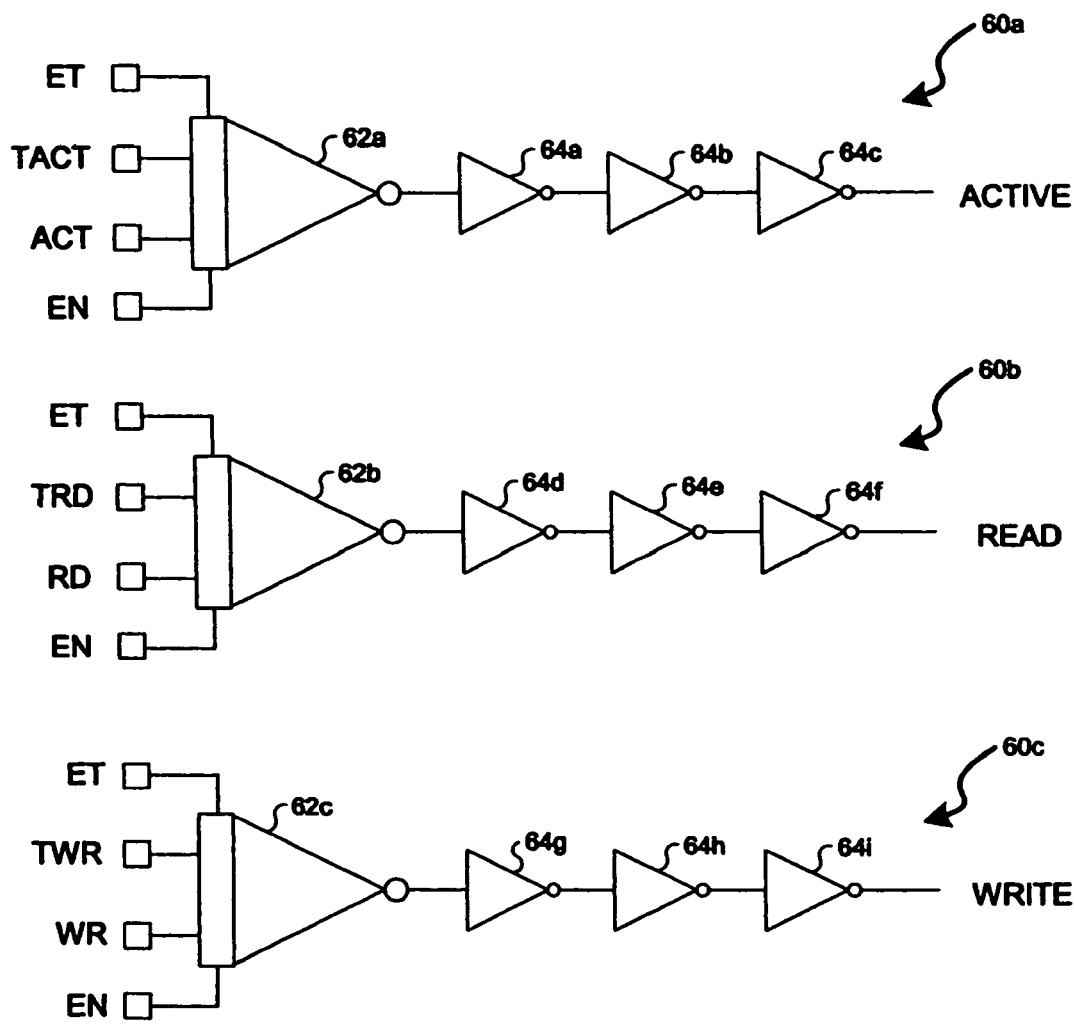
FIG._7
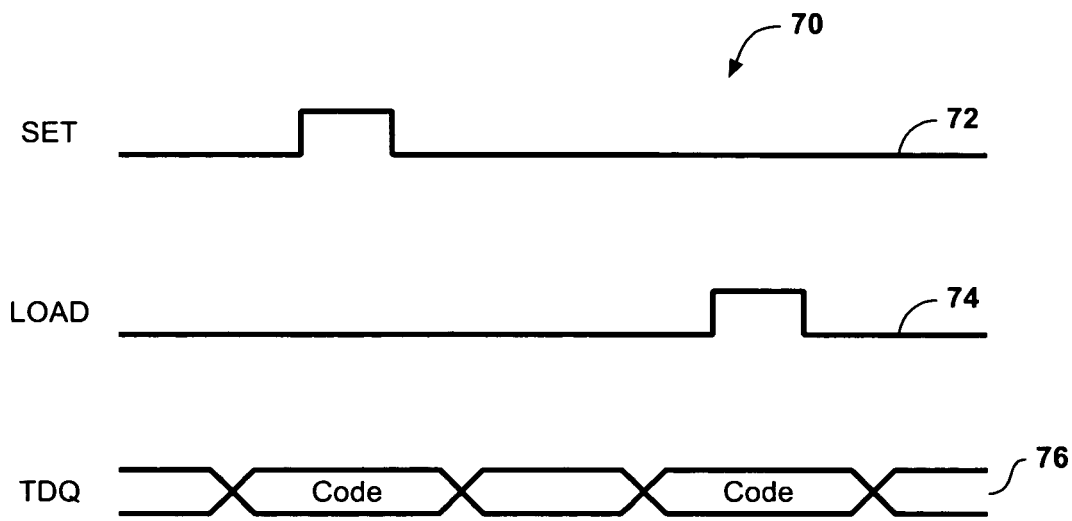
FIG._8

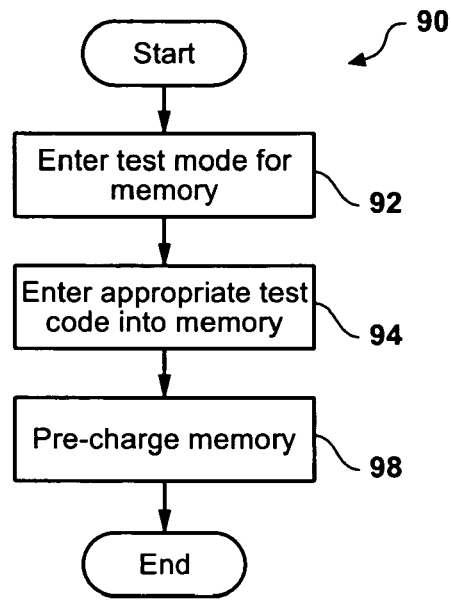
FIG._9
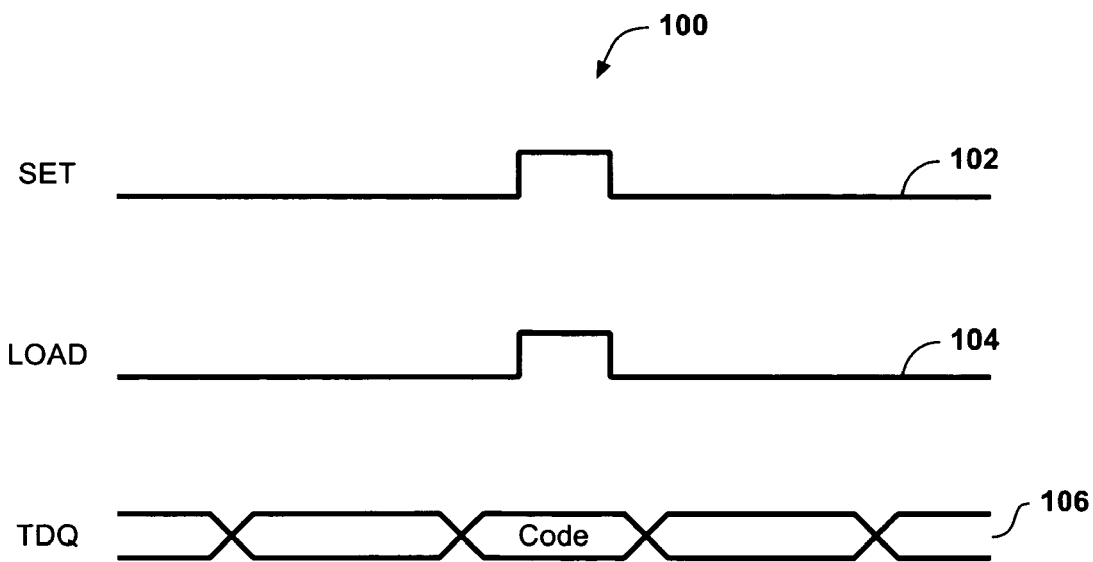
FIG._10

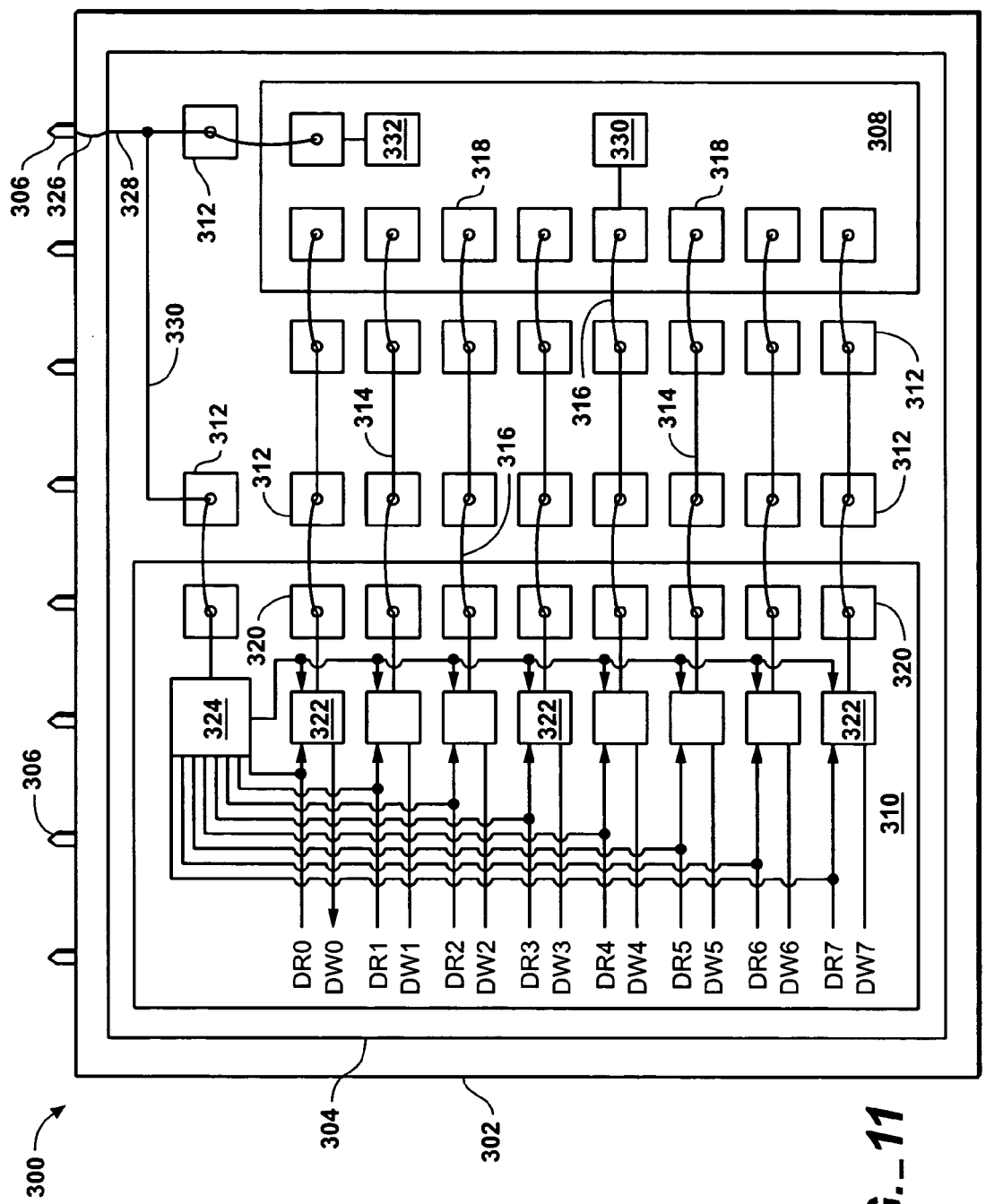
FIG._11

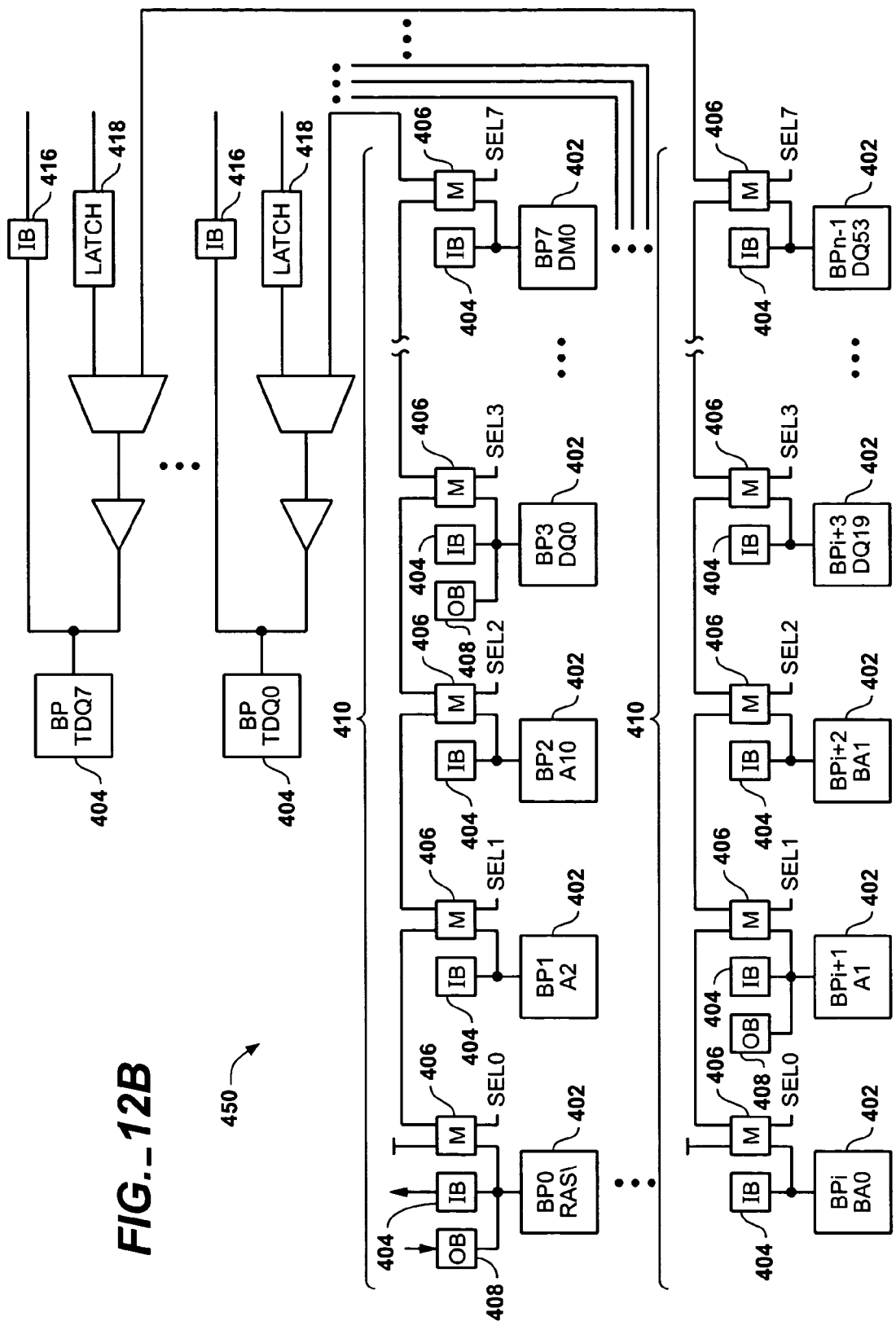
FIG._12B

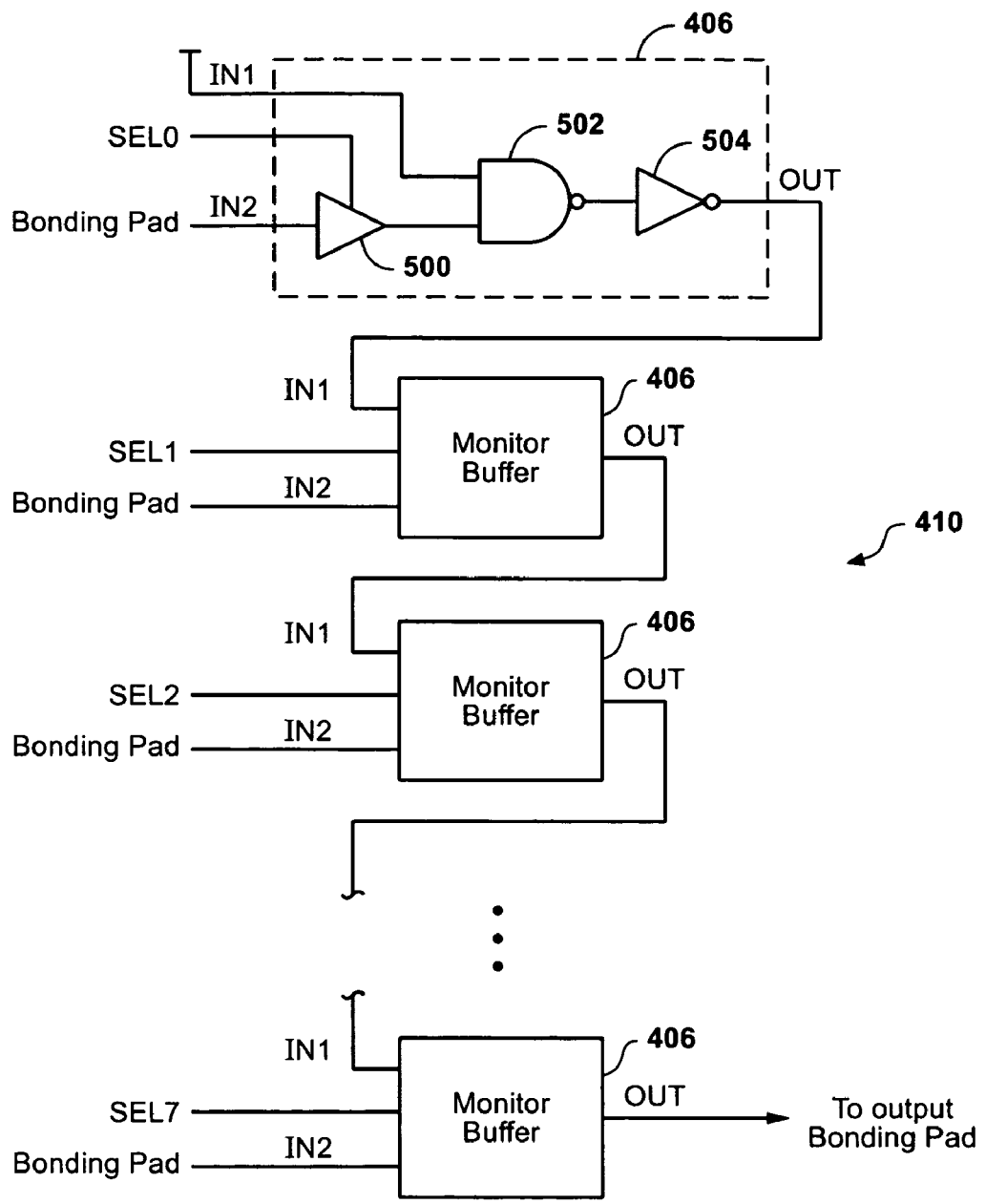
FIG._13

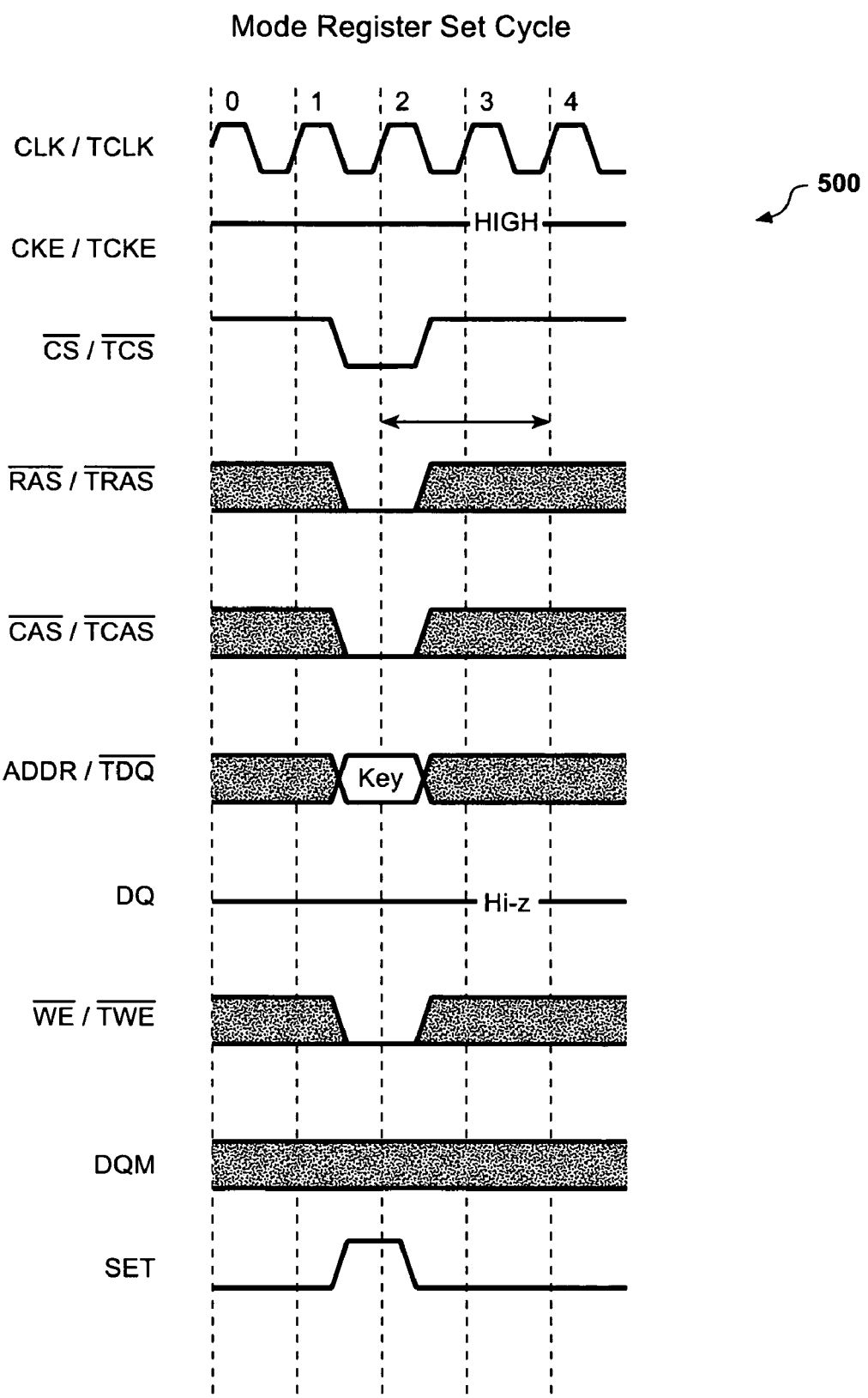
FIG._14

MONITORING SIGNALS BETWEEN TWO INTEGRATED CIRCUIT DEVICES WITHIN A SINGLE PACKAGE

CROSS-REFERENCE TO RELATED APPLICATION

The present application is related to co-pending U.S. patent application Ser. No. 10/679,673, filed on Oct. 3, 2003, and U.S. patent application Ser. No. 10/305,635, filed on Nov. 27, 2002, the entireties of which are both incorporated by reference herein.

TECHNICAL FIELD OF THE INVENTION

The invention relates generally to the field of semiconductor integrated circuits, and more particularly, to monitoring signals between two integrated circuit devices within a single package.

BACKGROUND

A semiconductor or integrated circuit (IC) device may comprise many miniaturized circuits implemented in a semiconductor substrate. IC devices must be tested in order to ensure proper operation before they are used. IC devices can be tested in a limited fashion using built-in self test (BIST) circuitry that is implemented within the IC devices themselves. BIST testing however, is incomplete and does not test all aspects of operation. Thorough testing of an IC device is accomplished with complex external testing equipment. In order for complex test equipment to be used, many dedicated input/output (I/O) pins are typically required for allowing the test equipment to input various test patterns, codes, and data, and to stress the circuitry of the IC device. In an environment where multiple IC devices are combined within a single package having a limited number of input/output (I/O) leads, however, it can be difficult if not impossible to dedicate one or more I/O leads for testing of the IC devices. Furthermore, once the multiple IC devices are enclosed within a single package, it is difficult or impossible with monitor the signals which are communicated between the IC devices.

SUMMARY

According to one embodiment of the present invention, a method is provided for monitoring signals communicated between a first integrated circuit chip and a second integrated circuit chip within a single packaged semiconductor device, wherein at least some external terminals for the packaged semiconductor device are shared by the first and second integrated circuit chips. The method includes the following: receiving signals from the first integrated circuit chip at a plurality of bond pads on the second integrated circuit chip; selecting a portion of the received signals; and outputting the selected portion of the received signals from the single packaged semiconductor device.

According to another embodiment of the present invention, a method is provided for monitoring signals communicated between a first integrated circuit chip and a second integrated circuit chip within a single packaged semiconductor device. At least some external terminals for the packaged semiconductor device are shared by the first and second integrated circuit chips, and the second integrated circuit chip comprises a plurality of monitor buffers connected in daisy chain arrangement. Each monitor buffer is associated with a respective bond pad on the second integrated circuit chip for receiving signals from the first integrated chip. The method includes the following: receiving signals from the first integrated circuit chip at the plurality of bond pads on the second integrated circuit chip; selecting one of the monitor buffers in the daisy chain arrangement; and relaying the signal received at the bond pad associated with the selected monitor buffer through some portion of the daisy chain arrangement.

According to yet another embodiment of the present invention, a system includes a first integrated circuit chip packaged in a semiconductor device. A second integrated circuit chip is packaged along with the first integrated circuit chip in the same semiconductor device. At least one external terminal for the semiconductor device is shared by the first and second integrated circuit chips for the transfer of signals between the first or second integrated circuit chip and circuitry external to the semiconductor device. The second integrated circuit chip comprises monitoring circuitry for allowing the monitoring of signals sent from the first integrated circuit chip to the second integrated circuit chip.

According to still another embodiment of the present invention, a first integrated circuit chip is provided for packaging along with a second integrated circuit chip in a single packaged semiconductor device. The first integrated circuit chip includes a plurality of bond pads at which signals can be received from the second integrated circuit chip. A plurality of monitor buffers is connected in a daisy chain arrangement. Each monitor buffer is associated with a respective one of the plurality of bond pads.

Important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which:

FIG. 1A is a block diagram of an exemplary semiconductor device, according to an embodiment of the present invention.

FIG. 1B is a block diagram of another exemplary semiconductor device, according to an embodiment of the present invention.

FIG. 2A is schematic diagram of an exemplary implementation of a test buffer multiplexer circuit, according to an embodiment of the present invention.

FIG. 2B is schematic diagram of another exemplary implementation of a test buffer multiplexer circuit, according to an embodiment of the present invention.

FIG. 2C is schematic diagram of yet another exemplary implementation of a test buffer multiplexer circuit, according to an embodiment of the present invention.

FIG. 3 is a schematic diagram of an exemplary implementation of an input buffer circuit.

FIG. 4 is a schematic diagram of an exemplary implementation of a test input control buffer circuit, according to an embodiment of the invention.

FIG. 5 is a schematic diagram of an exemplary implementation of a level detect circuit, according to an embodiment of the invention.

FIG. 6 is a schematic diagram of an exemplary implementation of a circuit for generating enable test and enable normal signals, according to an embodiment of the invention.

FIG. 7 is a schematic diagram of an exemplary implementation of control signal multiplexer circuits, according to an embodiment of the invention.

FIG. 8 is an exemplary timing diagram of a set and load sequence, according to an embodiment of the invention.

FIG. 9 is an exemplary flowchart of method for placing a one integrated circuit chip into a setup or condition so that another, co-packaged integrated circuit chip can be tested, according to an embodiment of the invention.

FIG. 10 is an exemplary timing diagram of a set and load sequence for setting up one integrated chip so that another integrated chip can be tested, according to an embodiment of the invention.

FIG. 11 is a block diagram illustrating a multi-chip module, according to embodiment of the present invention.

FIG. 12B is a schematic diagram of another exemplary implementation of a circuit for allowing the monitoring of signals between two integrated circuit chips in a single package, according to an embodiment of the invention.

FIG. 13 is a schematic diagram of an exemplary implementation of a daisy chain arrangement of monitor buffers, according to an embodiment of the invention.

FIG. 14 is an exemplary timing diagram for loading a test code during a cycle for the mode register set (MRS) commands, according to an embodiment of the invention.

DETAILED DESCRIPTION

Figure 12A:
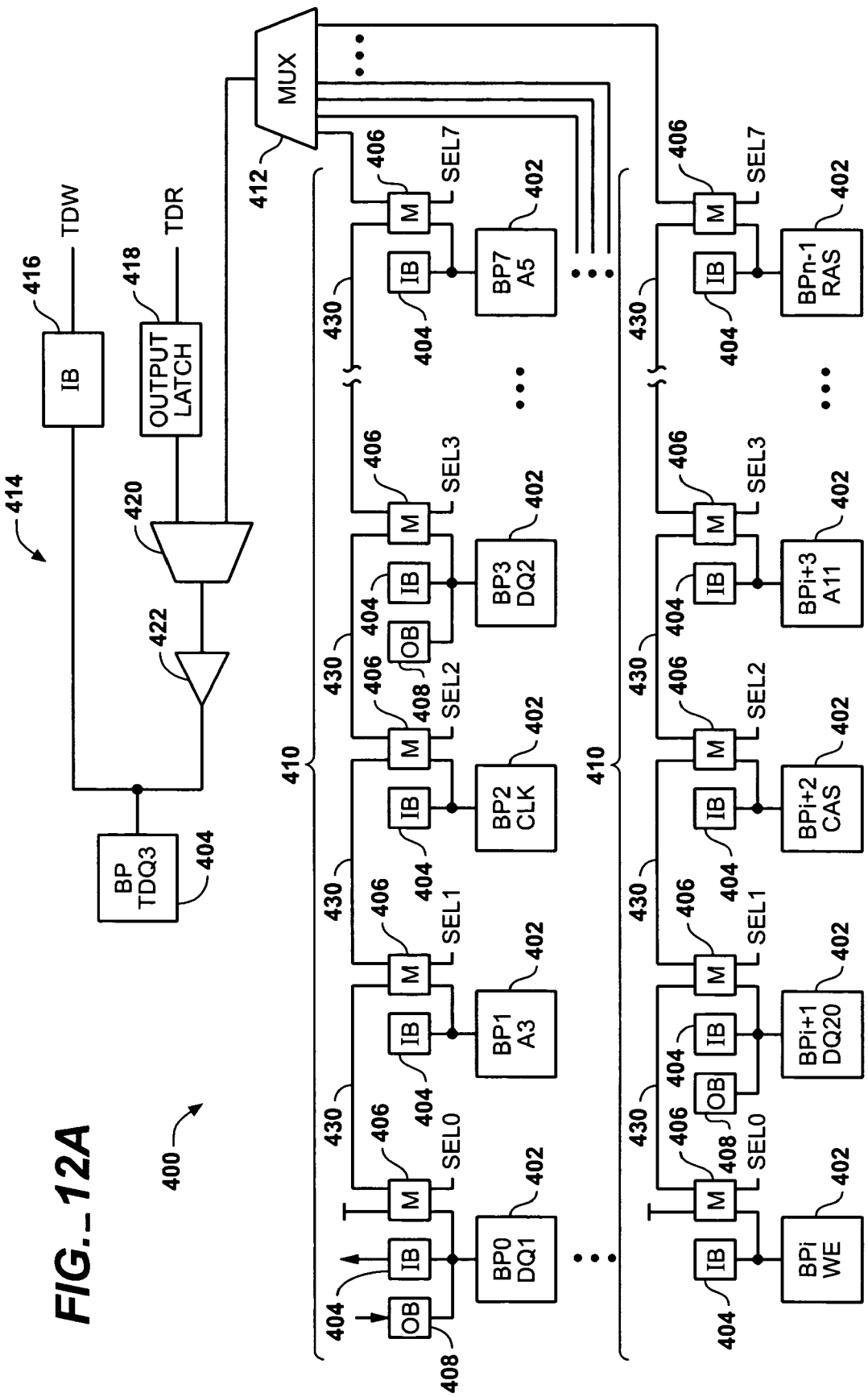
FIG. 12A is a schematic diagram of an exemplary implementation of a circuit for allowing the monitoring of signals between two integrated circuit chips in a single package, according to an embodiment of the invention.

The embodiments of the present invention and their advantages are best understood by referring to FIGS. 1 through 14 of the drawings. Like numerals are used for like and corresponding parts of the various drawings.

Semiconductor Devices

FIGS. 1A and 1B illustrate exemplary semiconductor devices 10 and 50 in which systems and methods, according to various embodiments of the invention, can be incorporated and used. Semiconductor devices 10 and 50 represent any type of integrated circuit (IC) device (also referred to herein as a packaged device) that may require testing, such as, for example, by external automated test equipment or an integrated circuit tester. Each of semiconductor devices 10 and 50 can be packaged as a standard ball grid array (BGA) or thin quad flatpack (TQFP) having 144 pins or more. However, other types of packaging may be used. For example, the packaging may have a ceramic base with wire bonding or employing thin film substrates, and mounting on a silicon substrate or a printed circuit board (PCB) substrate. The packaging may further utilize various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), to name but a few, and utilizing various leads (e.g., J-lead, gull-wing lead) or BGA type connectors.

FIG. 1A is a block diagram of an exemplary semiconductor device 10, according to an embodiment of the present invention. As depicted, semiconductor device 10 may comprise a system integrated circuit (IC) 12 and a memory 14. Each of system IC 12 and memory 14 can be implemented in a separate semiconductor die (commonly referred to as a "chip"). Each die is a monolithic structure formed from, for example, silicon or other suitable material. Accordingly, semiconductor device 10 can be referred to as a "multi-chip module" (MCM).

System IC 12 can be a chip with logic circuitry, such as, for example, an application specific integrated circuit (ASIC), a processor, a microprocessor, a microcontroller, a field programmable gate array (FPGA), programmable logic device (PLD), complex programmable logic device (CPLD), or other logic device. Memory 14 can be an IC memory chip, such as, for example, static random access memory (SRAM), dynamic random access memory (DRAM), synchronous DRAM (SDRAM), non-volatile random access memory (NVRAM), and read only memory (ROM), such as erasable programmable ROM (EPROM), electrically erasable programmable ROM (EEPROM), and flash memory.

System IC 12 and memory 14 may work in conjunction. Memory 14 provides storage capability for data/information that is provided from system IC 12 or some other components. System IC 12 provides processing capability for operating on data/information, and may retrieve information from and store information into memory 14. In normal operation for semiconductor device 10, signals for data/information may be received by memory 14 from system IC 12.

System IC 12 and memory 14 may each comprise one or more bond pads 16, which can be connected via, for example, bonding wires 18, to provide communication between the chips and/or other components within or external to semiconductor device 10. As used herein, the terms "connected," "coupled," or any variant thereof, means any connection or coupling, either direct or indirect, between two or more elements. For clarity, in FIG. 1A, only a portion of the bond pads 16 and bonding wires 18 are provided with reference numerals. At least some of the bond pads 16 and bonding wires 18 may support communication directly between system IC 12 and memory 14.

In one embodiment, system IC 12 and memory 14 may be mounted in a side-by-side arrangement on a printed circuit board (PCB) substrate, such as for a multi-chip package (MCP). Such PCB substrate may also have bond pads 16 and traces 19. In one embodiment, at least some traces 19 formed on either memory 14 or system IC 12 may be used for pin-out for the other chip.

As shown, semiconductor device 10 includes a number of external terminals 20 which can be, for example, input/output (I/O) leads or pins. For clarity, in FIG. 1A, only some of the external terminals 20 are provided with reference numerals. In general, these external terminals 20 enable the components within semiconductor device 10 to exchange data/information with components external to device 10. In one embodiment, one or more of these external terminals 16 may be connected to and serve both the system IC 12 and memory 14. That is, a terminal 20 which provides I/O capability for the system IC 12 may also provide I/O capability for memory 14.

To verify that semiconductor device 10 is operating properly, the components contained therein should be thoroughly tested. For this purpose, in one embodiment, memory 14 may receive signals from test equipment that is external to device 10. One or more test buffer multiplexer circuits 22 may be provided or incorporated in memory 14. Each multiplexer circuit 22 generally functions to multiplex between signals that are generated in normal operation of semiconductor device 10 and signals that are generated for testing of semiconductor device 10. The signals generated in normal operation may originate from system IC 12, whereas the signals for testing may originate from external test equipment.

Memory 14 may also comprise an on-chip sequence pattern generator, such as that described in related U.S. application Ser. No. 10/205,883 entitled "Internally Generating Patterns For Testing In An Integrated Circuit Device," filed on Jul. 25, 2002, assigned to the same assignee and incorporated by reference herein in its entirety. Such pattern generator may comprise a test column address counter and a test row address counter. The test column address counter may increment independently of the test row address counter. The address counters may function to internally generate sequences of numbers for use as addresses during testing.

If memory 14 were packaged as a discrete component (i.e., separate from system IC 12), thorough testing of the memory would require full access to all data, control, and access points of memory 14 so that complete test patterns could be input and extracted from the memory. But since memory 14 is packaged with system IC 12 in semiconductor device 10 and various access points of memory 14 are connected to system IC 12 for normal operation, test buffer multiplexer circuits 22 enable full access to memory 14 by multiplexing between signals from system IC 12 in normal operation and signals from external test equipment during testing. In this way, the external terminals 20 which are shared between the memory 14 and system IC 12 can imitate test pins which would be dedicated if memory 14 were packaged separately.

In one embodiment, the signals which are multiplexed can be clock enable (CKE), chip select (CS), row address strobe (RAS), column address strobe (CAS), write enable (WE), data read/write mask (DQM), bank select (BA), all row precharge (AP), bi-directional test data I/O (TD), set (SET), and load (LOAD), and respective testing counterparts for the same. It should be understood, that in other embodiments, signals in addition to or other than one or more of those described immediately above may be multiplexed.

In addition, one or more external terminals 20 may be dedicated (i.e., not shared between system IC 12 and memory 14) for testing of memory 14. In one embodiment, these dedicated terminals 20 can receive signals for test (TEST), analog word-line voltage (VCCP), and analog memory substrate voltage (VBB). The TEST signal generally functions to put memory 14 in test mode. The VCCP and VBB signals are used for stressing the memory 14 by providing voltage levels significantly above or below VDD and VSS. In another embodiment, only one external terminal 20—i.e., the one for the TEST signal—is dedicated for the testing of memory 14, and the signals for VCCP and VBB are generated internally within memory 14. This reduces pin count for the semiconductor device 10. In yet another embodiment, the external terminal which receives the TEST signal may be shared between the memory 14 and system IC 12. In such case, a voltage level which differs from the voltage levels used in normal operation is applied to the external terminal to put the memory 14 into test mode, as discussed herein in more detail.

Semiconductor device 10 can work in normal operation or be placed in a test mode. In normal operation, system IC 12 and memory 14 may cooperate to receive, process, store, and output data and information. In test mode, one or both of system IC 12 and memory 14 may be functionally tested to verify proper operation. With embodiments of the present invention, memory 14 can be tested completely separately from system IC 12, and vice versa. During test mode, in some embodiments, signals exchanged between system IC 12 and memory 14 may be monitored and "read" out of semiconductor device 10, as further described herein.

In one embodiment, semiconductor device 10 (and in particular, memory 14) can be placed in a test mode with various control signals, such as, for example, the TEST, SET, and LOAD signals. Memory 14 may include a test input control buffer circuit 40, which generally functions to receive and buffer control signals for programming of the memory 14. In some embodiments, the TEST signal is made a high value (or "1", such as VDD) and remains high throughout in-package testing. The SET and LOAD signals are initially at a low value (or "0", such as GND). Then the SET and LOAD signals are pulsed high for predetermined periods (e.g., 10 ns) to enable test buffer multiplexer circuits 22 on memory 14. The device 10 is now in test mode.

In some embodiments, test mode may be desirable if power and ground pins for the semiconductor device 10 (and/or traces 19 in the PCB substrate) are shared between memory 14 and system IC 12. In other embodiments, if separate power planes are provided for each of memory 14 and system IC 12, then a test mode may not be used.

In test mode, there may be two phases: a programming phase and an access phase. In the programming phase, the memory 14 can be set up or programmed for testing. This set up can include, for example, loading test addresses and sequential test data patterns (or codes) into various parts of the memory 14 (e.g., row and column test counters). In one embodiment, one or more test data (TDQ) signals may be used to program test modes, load test addresses, load test vectors, and load test patterns. The SET and LOAD signals can be used to enable test addresses or vectors to be set and loaded. An exemplary timing diagram illustrating the pulses for SET and LOAD signals to program a code in memory 14 is shown and described with reference to FIG. 8 below. All test mode programming can be performed asynchronously (i.e., no clock is required). In one embodiment, a test control (TCNT) is set to a high value ("1") to cause the memory 14 to exit the programming phase and enter the access phase.

In the access phase, the memory 14 is actually operated using the test addresses and test patterns. In one embodiment, all external and burst counter addresses are ignored by memory 14 while in access phase. The memory 14 only recognizes the addresses from the programmed row and column test counters. The TDQ signals are now used to read and write data to memory 14. A test stop row (TSR) counter signal may be used to stop the row address counter, and a test stop column (TSC) counter signal may be used to stop the column address counter while in access phase. This allows independent incrementation (or decrementation) of row and column addresses. Both the TSR and TSC counter signals may be independent of the CLK signal using external test pads, or they can be generated internally using SET/LOAD test mode generator, or using a test mode register set (MRS) command. In general, with some embodiments, programming of memory 14 during testing can be asynchronous. In other embodiments or as an option, programming can be synchronous for memory 14. Also, during access phase, the memory 14 may operate synchronously or asynchronously, depending on the memory specification.

In one embodiment, the memory 14 can enter access phase while remaining in the programming phase. That is, while in access phase, new test modes can be still set or programmed. For example, the memory 14 may be in pre-charge condition while programming in on-going. And after new testmodes are set or programmed, the memory 14 can be re-tested.

In some embodiments, the initial burst address is from the column test counter but subsequent burst address is from the normal burst counter. Also, in some embodiments, a bond pad for a RESET signal can be removed to save space. Removing the bond pad for the RESET signal may be useful but not absolutely necessary since the TEST signal going inactive will reset all test mode registers and commands. The test MRS command can be used to generate RESET (or any other test mode) to reset certain test modes and keep certain test modes while TEST is still active (i.e., the device still in test mode) so that it is not necessary to re-set test modes and re-load test vectors.

In one embodiment, as another aspect of test mode, the signals communicated between the chips or dies (i.e., at the interface between system IC 12 and memory 14) within the packaged semiconductor device 10 can be monitored. For this interface monitoring, in one implementation, certain signals at the interface may be selected and output from the packaged semiconductor device 10, for example, through the bond pads for one or more TDQ signals.

To exit test mode, in one embodiment, the TEST signal is brought to a low value ("0"), which clears all test operations and disables the test input buffers.

The RESET signal can be used to reset to programming mode without exiting test mode (keeping TEST active high). This provides efficiency in testing. For example, a tester can change one or a few test modes, re-load different test patterns, and then run the access test again. In one embodiment, once test mode has been exited, a tester may need to re-load everything again. The RESET signal may require an additional pad or dedicated external terminal 20. Alternatively, the RESET signal does not need to be dedicated, but rather can be multiplexed with another pin or terminal for system IC 12 or the semiconductor device 10.

With the systems and methods, according to various embodiments of the invention, an IC chip (e.g., memory 14) which is packaged along with one or more other chips (e.g., system IC 12) can be fully tested without requiring a significant number of dedicated I/O terminals. Control signals from complex external test equipment (e.g., a standard external memory tester) can be provided to all data, control, and access pads of the desired IC chip for thorough and complete testing using a variety of test patterns and sequences. These embodiments provide complete and flexible testing of IC devices.

In some embodiments, the systems and methods described herein can be used in conjunction with the systems and methods described in related U.S. application Ser. No. 09/666,208 entitled "Chip Testing Within a Multi-Chip Semiconductor Package," filed on Sep. 21, 2000, assigned to the same assignee and incorporated by reference herein in its entirety.

FIG. 1B is a block diagram of another exemplary semiconductor device 50, according to an embodiment of the present invention. Semiconductor device 50 can be similar in many respects to semiconductor device 10 depicted in FIG. 1A. That is, semiconductor device 50 may comprise a system IC 12 and a memory 14 (each with bond pads 16 provided thereon), and external terminals 20 for communicating data/information into and out of semiconductor device 50. Memory 14 receives signals from system IC 12. Furthermore, memory 14 may comprise one or more test buffer multiplexer circuits 22 for enabling multiplexing between signals generated in normal operation and signals generated for testing, thereby allowing memory 14 to be thoroughly tested with external test equipment.

In semiconductor device 50, system IC 12 and a memory 14 are provided in stacked arrangement. In this arrangement, system IC 12 may be attached to memory 14 using, for example, any suitable adhesive. Traces 19 may be formed on memory 14 for pin-out for system IC 12. Furthermore, although not depicted, some traces 19 may be formed on system IC 12 for pin-out for memory 14.

In one embodiment, one or both of the test analog voltages (i.e., word-line voltage (VCCP) and analog memory substrate voltage (VBB)) can be multiplexed with voltages used in normal operation. For this, respective test buffer multiplexer circuits 22 may be provided or incorporated in memory 14.

Test Buffer Multiplexer Circuit

FIG. 2A is schematic diagram of an exemplary implementation of a test buffer multiplexer circuit 22, according to an embodiment of the present invention. Test buffer multiplexer circuit 22 may be implemented or incorporated in a memory 14 to supporting the testing thereof. In this embodiment, as depicted, test buffer multiplexer circuit 22 comprises buffer circuits 30a, 30b and pass gate circuits 32a, 32b.

One buffer circuit 30b may be connected to receive a signal (e.g., data (DQ)) from system IC 12, while the other buffer circuit 30a may be connected to receive a corresponding test signal (e.g., test data (TDQ)) from a testing machine via an external terminal 20. Buffer circuit 30a is enabled by an enable test (ET) signal, while buffer circuit 30b is enabled with an enable normal (EN) signal. The ET and the EN signals can be complementary signals, and may both be supported by the same external pin or lead which, for example, receives the TEST signal. This external pin can be either dedicated for receiving the TEST signal to the place the memory 14 in test mode, or alternatively, shared between the memory 14 and a system IC 12. An exemplary implementation of a buffer circuit 30 is depicted in FIG. 3.

Pass gate circuit 32a is coupled at its input to receive the output of buffer circuit 30a. Pass gate circuit 32b is coupled at its input to receive the output of buffer circuit 30b. Both pass gate circuits 32 receive the enable test and enable normal signals. Each pass gate circuits 32 generally function to pass the value of a signal appearing at its input as the value of its output signal upon a particular combination of values for the enable test and enable normal signals. For example, in one embodiment, when the enable test signal has a high value (or "1") and the enable normal has a low value (or "0"), then the value of the output signal from buffer circuit 30a appears at output Y for the test buffer multiplexer circuit 22. An exemplary implementation of pass gate circuit 32 is described in related U.S. application Ser. No. 09/967,389 entitled "Testing of Integrated Circuit Devices," filed on Sep. 28, 2001, assigned to the same assignee and incorporated by reference herein in its entirety.

Although only a single test buffer circuit 22 is depicted here in FIG. 2A for the data signal and its counterpart test signal, it should be understood that a plurality of test buffer circuits 22 may be provided on a memory 14 for multiplexing various other signals from a system IC 12 (e.g., CLK, CKE, CS, RAS, CAS, WE, DQM, BA, and AP) and their counterpart test signals (e.g., TCLK, TCKE, TCS, TRAS, TCAS, TWE, TDQM, TBA, and TAP).

In operation, when the memory 14 on which test buffer multiplexer circuit 22 is implemented is in normal operation, then the value of the signal from the system IC (e.g., DQ) is buffered and passed as the output Y of the multiplexer circuit 22. Alternatively, when the memory 14 is placed in test mode, then the value of signal from external testing equipment (e.g., TDQ) is buffered and passed as the output Y of the multiplexer circuit 22.

FIG. 2B is schematic diagram of another exemplary implementation of a test buffer multiplexer circuit 22, according to an embodiment of the present invention. In this embodiment, as depicted, test buffer multiplexer circuit 22 comprises buffer circuits 34a, 34b and NAND gate 36.

Buffer circuits 34b may be connected to receive a signal (e.g., data (DQ)) from system IC 12, and buffer circuit 34a may be connected to receive a corresponding test signal (e.g., test data (TDQ)) from a testing machine via an external terminal 20. Buffer circuits 34a and 34b are enabled by the enable test (ET) and enable normal (EN) signals, respectively. NAND gate 36 receives and performs a "NAND" operation on the outputs of buffer circuits 34a and 34b. NAND gate 36 outputs a value of the Y signal, which is the output for the multiplexer circuit 22.

As with FIG. 2A, although only a single test buffer circuit 22 is depicted here in FIG. 2B for the data signal and its counterpart test signal, it should be understood that a plurality of test buffer circuits 22 may be provided on a memory 14 for multiplexing various other signals from a system IC 12 and their counterpart test signals.

FIG. 2C is schematic diagram of yet another exemplary implementation of a test buffer multiplexer circuit 22, according to an embodiment of the present invention. In this embodiment, as depicted, test buffer multiplexer circuit 22 comprises buffer circuits 50a, 50b, 50c, inverter gates 52a, 52b, 52c, 52d, data buffers 54a, 54b, a multiplexer (MUX) 56, and a NOR gate 58.

Buffer circuit 50a and inverter gates 52a, 52b may be part of a path for inputting program code data into memory 14, for example, during a programming phase of test mode for the memory 14. Buffer circuit 50a may receive a test signal (e.g., test data (TDQ)) from an external test machine. Buffer circuit 50a can be enabled by a signal that is derived from logic operations on the enable test (ET) and a test control or test counter (TCNT) signal. The output of this buffer circuit 50a and inverter gates 52a, 52b is a TDA signal for programming memory 14. In one embodiment, eight TDA signals (i.e., TDA[0:7]) may be supported for programming up to 256 test codes. Eight TDQ signals (i.e., TDQ[0:7]) may be supported as well.

In one embodiment, the TCNT signal may default to a low value upon entry into test mode. If the memory 14 is in the programming phase of test mode, the TCNT signal may have a low value. If memory 14 is in the access phase of test mode, test control (TCNT) signal may have a high value. TCNT signal may be set to a high value using the SET and LOAD (code) signals. For example, in one embodiment, the TCNT signal can be set to VDD by bringing the SET signal to a high value with the values of TDQ[7:0]=00110000. The LOAD signal is used for loading registers, such as test address or test pattern.

Buffer circuit 50b and data buffer 54a may be part of a path for inputting test data into memory 14, for example, during an access phase of test mode for the memory 14. Buffer circuit 50b is enabled by the enable test (ET) signal and may receive the test data (TDQ)) from an external test machine. Data buffer 54a is connected to receive the output signal of buffer circuit 50b and a clock (CLK) signal. Data buffer 54a latches the output of circuit 50b and may output the same on an edge of the CLK signal.

Buffer circuit 50c and data buffer 54b may be part of a path for inputting data into memory 14, for example, during normal operation for the memory 14. Buffer circuit 50c is enabled by the enable normal (EN) signal and may receive the data (DQ)) from system IC 12. Data buffer 54b is connected to receive the output signal of buffer circuit 50c and a clock (CLK) signal. Data buffer 54b latches the output of circuit 50c and may output the same on an edge of the CLK signal.

Multiplexer 56 is connected to receive the output signals of data buffers 54a and 54b, and can be enabled with a TEST signal, a TSTEN signal, or a TCNT signal. Depending on the values of the EN and ET signals, multiplexer 56 will pass (via inverter gate 52c) either the output of data buffer 54a or the output of data buffer 54b to other circuitry on memory 14. In particular, if memory 14 is in test mode (access phase), the output of data buffer 54a is provided to the memory 14 for testing of same. If memory 14 is in normal operating mode, the output of data buffer 54a is provided to the memory 14. In other embodiments, other circuit, such as a NAND gate, can be used instead of multiplexer 56.

Test Input Control Buffer Circuits

FIG. 4 is a schematic diagram of an exemplary implementation of a test input control buffer circuit 40, according to an embodiment of the invention. Test input control buffer circuit 40 may be implemented or incorporated in a memory 14 to supporting the testing thereof. Test input control buffer circuit 40 generally functions to receive and buffer control signals for programming of memory 14 during the programming phase of test mode. As depicted, test control buffer circuit 40 comprises a level detect circuit 42, input buffer circuits 44a, 44b, and 44c, and inverter gates 46a, 46b, and 46c.

Level detect circuit 42 is optional and can be provided as part of test input control buffer circuit 40 when the external pin or lead for receiving the TEST signal is shared between the memory 14 and a system IC 12. In such case, because it would be undesirable to inadvertently place memory 14 into test mode during normal operation, a voltage level which differs from the voltage levels used in normal operation is used for putting the memory 14 into test mode. This voltage level can be, for example, a negative voltage (e.g., −3V) or a higher than normal voltage (e.g., 7V if VDD for memory 14 is 3.3V). Level detect circuit 42 receives the external TEST signal (XTEST) and generates an internal test enable (TSTEN) signal that is provided to each of input buffer circuits 44a, 44b, and 44c. The TSTEN signal enables input buffer circuits 44. An exemplary implementation for level detect circuit 42 is depicted in FIG. 5.

Referring again to FIG. 4, if the external pin for receiving the TEST signal is dedicated, level detect circuit 42 is not needed and thus would not be present in test input control buffer circuit 40. In this case, the external TEST signal can be applied directly to input buffer circuits 44. In one embodiment, for this situation, a high value for the TEST signal causes memory 14 to be in test mode, while a low value for the TEST signal takes memory 14 out of test mode.

A separate combination of input buffer circuit 44 and inverter gate 46 is provided for each of a number of programming control (PRG) signals, such as, for example, the SET, LOAD, and RESET signals. For each combination, when the input buffer circuit 44 is enabled, the respective control signal is buffered in circuit 44 and output to the inverter gate 46 where the signal is inverted. The output of each inverter gate 46 is a respective program P signal (separately labeled P1, P2, P3). The program P signals may be provided to control the test programming of the memory 14 when it is in the programming phase of test mode. For example, these program P signals can be used to set flags and other conditions in memory 14.

It should be noted that in alternative implementations for a test input control buffer circuit 40, any number of input buffer circuits 44 and inverter gates 46, or any other suitable element could be used to support control signals that are in addition to, or instead of, the specific signals depicted in FIG. 4.

Enable Test and Enable Normal

FIG. 6 is a schematic diagram of an exemplary implementation of a circuit 80 for generating the enable test (ET) and the enable normal (EN) signals, according to an embodiment of the invention. As depicted, this circuit 80 comprises NAND gates 82a, 82b, 82c, delay circuits 84a, 84b, and inverter gates 86a, 86b, and 86c.

NAND gate 82a can be connected to receive the program P and TSTEN signals from the test input control buffer circuit 40. The program P signals can be associated with or correspond to the SET, LOAD, and RESET signals. The delay circuits 84a and 84b delay the output generated by the NAND gate 82a. The delay circuits 84a and 84b may also filter noise or voltage spikes, and may prevent unintentional entry into test mode. Delay circuits 84a and 84b may be replaced with a single, larger delay circuit in alternative embodiments.

NAND gates 82b and 82c are cross-connected at one input each. The other input of NAND gate 82b is connected to receive the output of delay circuit 84b. The other input of NAND gate 82b is connected to receive a test reset (TR) signal. The test reset signal, which may be derived from a reset signal, can be used to reset an individual test mode without completely exiting test mode. Inverter gates 86a and 86b are connected to receive the output of NAND gate 82b, while NAND gate 82d and inverter gate 86c are connected to receive the output of NAND gate 82c. The output of inverter gate 86b is the enable test (ET) signal, and the output of inverter gate 86c is the enable normal (EN) signal. The ET and EN signals may be applied to the test buffer multiplexer circuit 22 (see FIGS. 2A, 2B, and 2C).

In operation, depending on the combination of values for the TSTEN and program P signals, circuit 80 will output particular values for the enable test (ET) and the enable normal (EN) signals for enabling the test or normal buffers.

Control Signal Multiplexer Circuits

FIG. 7 is a schematic diagram of an exemplary implementation of control signal multiplexer circuits 60a, 60b, and 60c, according to an embodiment of the invention. Control signal multiplexer circuits 60 may be implemented or incorporated in a memory 14 to supporting the testing thereof.

In general, each control signal multiplexer circuit 60 functions to receive, multiplex, and buffer a control signal and its counterpart test signal. These control signals can be, for example, an active (ACT) signal, a read (RD) signal, and a write (WR) signal, and the counterpart test signals can be a test ACT (TACT) signal, a test RD (TRD) signal, and a test WR (TWR) signal, respectively. The control signals (ACT, RD, and WR) may be received at pads 16 on memory 14 which are coupled to the system IC 12. The respective counterpart test signals (TACT, TRD, and TWR) may be received at pads which are connected to external terminals 20 that are shared between memory 14 and system IC 12. It should be understood, that in other embodiments, control signals in addition to or other than one or more of those described immediately above may be multiplexed.

As depicted, each control signal multiplexer circuit 60 comprises a multiplex buffer 62 (separately labeled 62a, 62b, and 62d) coupled to a plurality of inverter gates 64 (separately labeled 64a–64i).

In one embodiment, each multiplex buffer 62 can be implemented with substantially similar circuitry as used for either of the implementations of test buffer multiplexer circuit 22 depicted in FIGS. 2A and 2B. Each multiplex buffer 62 receives an enable test (ET) signal, an enable normal (EN) signal, a respective control signal, and the counterpart test signal. During normal operation for memory 14, multiplex buffer 62 is enabled by the enable normal signal, which allows the respective control signal (e.g., ACT, RD, or WR) to be buffered and output by the multiplex buffer 62. In test mode, multiplex buffer 62 is enabled by the enable test signal, which allows the respective counterpart test signal (e.g., TACT, TRD, or TWR) to be buffered and output by the multiplex buffer 62.

The output signal from a multiplex buffer 62 is provided to the first in a respective sequence of inverter gates 64. As shown, three inverter gates 64 are provided in each sequence. The output of the last inverter gate 64 of each sequence is provided as a control signal to memory 14, for either normal operation or testing (depending on the ET and EN signals).

It should be noted that other control signal multiplexer circuits 60 may be provided to support control signals that are in addition to, or instead of, the specific signals depicted in FIG. 7.

Set and Load Sequence

FIG. 8 is an exemplary timing diagram of a set and load sequence 70, according to an embodiment of the invention. When memory 14 is in test mode, sequence 70 can be used to load codes into memory 14 during the programming phase. In particular, in one embodiment, test modes, test patterns and test addresses may be programmed in this phase.

Referring to FIG. 8, waveforms 72, 74, and 76 are given for the SET signal, the LOAD signal, and one or more TDQ signals. The one or more TDQ signals may be used to read and write test data, set test mode codes, load row and column addresses, program least significant bits (LSB) for row and column counters, and load test data patterns. In one embodiment, there can be eight TDQ signals: TDQ[0:7]. As the exemplary waveforms in FIG. 8 illustrate, the programming for testing memory 14 can be performed asynchronously (i.e., without a clock signal). The SET and LOAD signals are used to input codes for setting test modes and enable test address or vectors to be loaded. These codes may be provided in the one or more TDQ signals. The codes can indicate or represent, for example, any of the following: no test, load row address mode, reserve, load column address mode, set row counter LSB, set/load test data background equations, all even row enable, all odd row enable, disable all pumps and regulators, disable redundant rows and columns, set column counter LSB, start test counter, load data pattern, set row counter count down, set column counter count down, and individual DQ access mode.

For example, in one embodiment, to load an initial burst column address (i.e., the starting address in a column burst counter), the following command is issued using the timing shown in FIG. 8:

SET=1 with TDQ[7:0]=00000011→this sets the "Load Column Address" bit active (e.g., LCA=1).

LOAD=1 with TDQ[7:0]="start address"→load value at TDQs to the column address counter.

For setting just a test mode (e.g., disabling a voltage regulator, setting access phase (i.e., TCNT=1), or setting 8× parallel test modes), then the SET signal in combination with valid TDQs is sufficient. In one embodiment, test modes can be persistent or non-persistent. Test modes that are non-persistent go away once a new code is programmed. Test modes that are persistent will remain in effect even after a new code is programmed.

Memory Setup For Testing of System IC

In some embodiments, it may be desirable to test system IC 12 as well once it is packaged along with memory 14 in semiconductor device 10. System IC 12 may be tested using external terminals 16, some of which are shared with memory 14 for providing I/O capability. As such, memory 14 is desirably placed into a setup or condition so that it does not interfere, disrupt, or introduce unwanted or unexpected signal levels at the shared terminals 16 during the testing of system IC 12.

To accomplish this, according to one embodiment, memory 14 is put into a "power down" mode. In power down mode, the voltage pumps, regulators, and other bias analog circuits of memory 14 are shut down so that only minimal (i.e., leakage) current is flowing through the chip. One or more (up to all) input/output drivers or buffers (e.g., buffer circuits 30a and 30b) of memory 14 are tri-stated so that they do not drive any signals (e.g., DQ and TDQ signals) out of memory 14, especially to any connections for system IC 12. This allows various signals or parameters (e.g., the standby current or IDDQ) of system IC 12 to be measured accurately for testing of the system IC 12.

FIG. 9 is an exemplary flowchart of method 90 for placing a one integrated circuit chip into a setup or condition so that another, co-packaged integrated circuit chip can be tested, according to an embodiment of the invention. In one embodiment, one integrated circuit chip can be memory 14 and the other integrated circuit chip can be system IC 12. In other embodiments, the types of integrated circuit chips may be switched, both integrated circuit chips could be the same type, or one or both chips could be yet a different type (other than memory or logic). The setup or condition can be, for example, a power down mode.

Method 90 begins at block 92 where the one integrated circuit chip (e.g., memory 14) enters a test mode, as discussed herein. In one embodiment, to accomplish this, the TEST signal is brought to a predetermined value (e.g., HIGH or logic level "1") to enter test mode. The TEST signal may then be held at that value during testing. All other unused test pins can be brought to desired predetermined values (e.g., LOW or GND or logic level "0").

At block 94, an appropriate test code is entered into the memory 14. An exemplary timing diagram 100 of a set and load sequence for such test code is shown in FIG. 10. Referring to FIG. 10, waveforms 102, 104, and 106 are given for the SET signal, the LOAD signal, and one or more TDQ signals. The SET and LOAD signals are both brought to predetermined values (both HIGH in this example), and an appropriate test code is provided using the TDQ signals. In one embodiment, the values for the TDQ signals for this test code are TDQ[7:0]=00011100. In other embodiments, a greater or fewer number of TDQ signals may be used, with similar or different values. The values for the TDQ signals may function to disable analog and/or other circuits (e.g., voltage pumps and regulators) in memory 14.

Referring again to FIG. 9, at block 98, memory 14 is precharged, for example, using Test Clock and Test Command pins for semiconductor device 10. Precharge essentially closes a page of memory 14. In precharge condition, all rows of the memory 14 are turned off and the bit lines are pre-charged. With memory 14 in a precharge condition and various circuitry (e.g., DC bias circuits, regulators, and pumps) disabled, the current measured from memory 14 should be leakage current only. Accordingly, the one integrated circuit chip (e.g., memory 14) does not interfere with testing of the other integrated circuit (e.g., system IC 12). Method 90 then ends.

Thereafter, system IC 12 can be tested, for example, using appropriate external test equipment, routines, and processes with signaling into and out of the system IC 12 occurring through various external connections, some of which are shared with memory 14. The routines and processes may be similar to or the same as those which would be used to test system IC 12 if it were to be packaged alone, or alternatively, the routines and processes may be modified or adjusted for tri-stated signaling.

Monitoring of Interface Between Chips

In one embodiment, the present invention provides or allows the monitoring of die-to-die signals after assembly of multiple dies or chips into a single package (e.g., system IC 12 and memory 14 in semiconductor devices 10 and 50). This monitoring can be used, for example, to support testing for assembly errors. This monitoring can also be used as a debugger tool to check the respective signals of the various chips (e.g., system IC 12 and memory 14). In some embodiments, this monitoring can be performed during the test mode for the semiconductor devices. Furthermore, in some embodiments, the techniques for monitoring of die-to-die signals in the single packaged device can be accomplished without having additional external pins.

FIG. 11 is a block diagram illustrating a multi-chip module (MCM) 300, according to an embodiment of the present invention. MCM 300 can be a semiconductor packaged device, like semiconductor devices 10 and 50 described above, having multiple chips or dies contained within a single package. As depicted, MCM 300 comprises a chip package 302 having a number of input/output (I/O) pins or terminals 306, and containing a substrate 304 upon which a system chip 308 and a memory chip 310 are mounted. System chip 308 and memory chip 310 can be like system IC 12 and memory 14, described above. System chip 308 may comprise, for example, a processor, a microprocessor, a microcontroller, a field programmable gate array, an ASIC, or any other type of chip or logic device that may communicate with a memory chip. Memory chip 310 may comprise any type of memory such as, for example, random access memory (RAM) devices or read only memory (ROM) devices including static RAM (SRAM), dynamic RAM (DRAM), non-volatile RAM (NVRAM), programmable ROM (PROM), erasable programmable ROM (EPROM), electrically erasable programmable ROM (EEPROM), and flash memory.

System chip 308 is shown as having a number of bond pads 318 and bonding wires 316 which facilitate connections to substrate bond pads 312 on substrate 304 and allow communication of information between system chip 308 and other chips or components within or external to MCM 300. For example, system chip 308 communicates with memory chip 310 utilizing bond pads 318, bonding wires 316, traces 314, and memory bond pads 320. System chip 308 also communicates with components outside of MCM 300 utilizing one or more connections such as through bond pad 318, bonding wire 316, substrate bond pad 312, trace 328, lead wire 326, and terminal 306. Many other types of connections are possible between system chip 308 and memory chip 310 and between system chip 308 and terminals 306, but those shown in FIG. 11 are illustrative of the basic connections. For example, the connections between memory chip 310 and system chip 308 may represent a common memory bus utilizing a four-layer substrate, with separate power supply planes for each chip. System chip 308 may also have one or more input/output buffers or driver circuits 330 and 332 for receiving and driving the signals on the bond pads 318. As shown, buffer 330 is used for communicating from die to die within MCM 300, and buffer 332 is used for communicating with external components.

In one embodiment, system chip 308 may use different voltage levels for communicating with memory chip 310 (i.e., from die-to-die within MCM 300) versus communicating with components outside of MCM 300. For example, a first power level (e.g., 1.1V, 1.3V, 1.5V, or 1.8V) may be used for driving signals between chips, whereas a second power level (e.g., 1.8V, 2.5V, or 3.3V) may be used for driving or receiving signals with external components.

As depicted, memory chip 310 comprises a number of input/output buffers 322 along with a test buffer 324. Input/output buffers 322 permit the reading and writing of data (e.g., data (DQ[0:7])) to memory chip 310 from system chip 308. Each input/output buffer 322 can be a single-bit buffer—i.e., a buffer which supports the input or output of only a single bit of data at a given time. Test buffer 324 permits the direct testing of memory chip 310 by separately monitoring the data being read from memory chip 310 (e.g., test data (TDQ)) and providing this information directly to terminal 306 through traces 328, 330 when MCM 300 is placed into a memory test mode (as described herein). Test buffer 324 also can write information to memory chip 310 through input/output buffers 322, as described in further detail below.

In addition to the buffers 322 for data (DQ) and test buffer 324 for test data (TDQ), other buffers (and respective bond pads 320) may be provided in memory chip 310 for various other signals communicated between memory chip 310 and system chip 308 (e.g., clock (CLK), clock enable (CKE), chip select (CS), address (A), row address strobe (RAS), column address strobe (CAS), write enable (WE), data read/write mask (DQM), and bank select (BA)).

As shown, a designated terminal 306 is bonded to a particular bond pad 318 of system chip 308 as well as to a particular memory bond pad 320 utilized as the test input or test output pad for test buffer 324. In one embodiment, as shown, the memory bond pads 320 that are utilized by test buffer 324 do not connect directly to the substrate package memory bus that provides communication between memory chip 310 and system chip 308. Test buffer 324 may also be incorporated into one or more of the input/output buffers 322 such that one or more of the input/output buffers 322 also provides the test capabilities of test buffer 324 utilizing the principles of the present invention as described herein. For example, one input/output buffer 322 may incorporate test buffer 324, with an additional memory bond pad 320 utilized to input or output test data to one or more selected terminals 306.

Due to the incorporation of test buffer 324 and its direct connections to one or more terminals 306 of MCM 300, memory chip 310 can be thoroughly tested after it has been packaged and contained inside MCM 300. In particular, during normal operation, test buffer 324 is disabled (e.g., tri-stated) so that test buffer 324 does not interfere with the signals on one or more terminals 306 that are assigned to system chip 308.

When a memory test mode is enabled, however, those same pins can be employed as test pins for memory chip 310. That is, test buffer 324 transfers information through the designated terminals 306. In one embodiment, MCM 300 will be placed into a memory test mode when a specified terminal 306 on MCM 300 is asserted or selected. The specified terminal 306 may, for example, be an assigned test pin (i.e., a no-connect (NC) pin specifically used for memory test mode entry) or an input pin by which MCM 300 can recognize a test signal once a voltage level outside the normal operating range is established. Memory chip 310 is then tested while inside MCM 300 by reassigning certain terminals 306 also used by system chip 308 as test input/output pins for memory chip 310. The reassigned pins may then be used to provide addresses, input controls, data input/output signals, and other information to properly access and test memory chip 310.

Various other alternatives are possible. For example, one or more terminals 306 may be designated as test pins to provide a test signal to place memory chip 310 into a test mode and also to provide control and/or test data signals. Alternatively, the test signal to place memory chip 310 into a test mode may be generated directly by system chip 308 without requiring a designated test pin to initiate testing. Alternatively, a specified voltage range or sequence of voltages at a certain terminal 306 may initiate testing of memory chip 310. For example, a voltage-level sensor may monitor one or more of terminals 306 designated for system chip 308 and when a predetermined voltage level is detected, testing of the memory chip 310 is initiated. Thus, one or more of the above test initiation triggers provides many options and test flexibility.

As shown in FIG. 11, MCM 300 comprises a single memory chip 310 (e.g., a single DRAM) that is designed for in-package testing. It should be understood, however, that in other embodiments, multiple memory chips designed for in-package testing might also be employed utilizing the teachings of the present invention. If a single memory chip is provided, the test data bus and memory bus system may be optimized. For example, memory chip 310 may comprise a single, high-performance, synchronous DRAM of 512 Kb by 128 bits, with a wide test data bus and memory bus subsystem (used to communicate with system chip 308) having a width greater to or equal to 128 bits.

Other configurations are possible with memory chip 310 optimized to accommodate the requirements of system chip 308. For example, memory chip 310 may be configured as a 32, 64, 128, 256 bit, or greater size, with a bus width that is equivalent or greater in size to permit high-speed transfer of data between memory chip 310 and system chip 308. These principles may be applied to embedded memory also (i.e., memory integrated with other logic on a single die). Furthermore, memory chip 310 may be manufactured, for example, using a standard commodity memory process, with the incorporation of the teachings of the present invention, while system chip 308 may be manufactured using a standard logic process or other types of processes. Thus, MCM 300 is optimized for high performance chip-to-chip interface along with complete testing capability of the internal memory.

It should be understood that the present invention is not limited by the type of chip packaging and is applicable for any type of multi-chip semiconductor packaging. As an example, MCM 300 may comprise a standard ball grid array (BGA) or thin quad flatpack (TQFP) type of package having 144 pins or more. However, many other types of packaging may be used. For example, the chip packaging may be of various types of MCMs such as having a ceramic base with chips wire bonded (e.g., MCM-C) or employing thin film substrates (e.g., MCM-D), mounted on a silicon substrate (e.g., MCM-S), or mounted on a PCB substrate (e.g., MCM-L) such as a multi-chip package (MCP). The packaging may further utilize various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), to name but a few, and utilizing various leads (e.g., J-lead, gull-wing lead) or BGA type connectors.

In one embodiment, during normal operation of the MCM 300, buffer 332 on system chip 308 may be supplied with the higher voltage level (e.g., Vddq=1.8V, 2.5V, or 3.3V) while input/output buffer 322 on memory chip 310 may be supplied with the lower voltage level (e.g., Vddq=1.1V, 1.3V, 1.5V, or 1.8V). In this case, having separate Vddq buses internally for input/output buffers 322 and test buffer 324 allows test buffer 324 to also be supplied with the higher voltage level (e.g., Vddq=1.8V, 2.5V, or 3.3V), which is the same power supply level as for buffer 332 on system chip 308. This eliminates or substantially reduces the possibility of a latch-up, which would be more likely to occur if test buffer 324 were supplied by the lower voltage level (e.g., Vddq=1.1V, 1.3V, 1.5V, or 1.8V) and buffer 332 were supplied by the higher voltage level (e.g., Vddq=1.8V, 2.5V, or 3.3V).

As shown in FIG. 11, in memory chip 310 one test buffer 324 is provided for every eight input/output buffers 322 to provide an eight-to-one data compression (e.g., data multiplexing) for testing purposes. By employing data compression, fewer test buffers 324 and terminals 306 are required for testing of memory chip 310. For FIG. 11, if data compression was not used, eight or more pins would be required along with one test buffer 324 for every input/output buffer 322. Thus, data compression provides more efficient use of external terminals 306 and minimizes the number of bond pads and test buffers, along with associated circuitry, that is required to provide memory testing. Various data compression ratios may be selected, such as 2:1, 4:1, 8:1, 16:1, 32:1, 64:1, and 128:1. For example, for a 512 Kb by 128-bit memory and employing 16:1 compression, a minimum of eight test buffers and external terminal connections are required.

In one embodiment, one or both of system chip 308 and memory chip 310 may comprise circuitry for allowing the monitoring of the signals communicated therebetween after the chips 308 and 310 have been packaged together within the single chip package 302. This can be accomplished by "intercepting" the signaling at certain bond pads 318 of system chip 308 or bond pads 320 of memory chip 310 which are part of the communication path between the chips 308 and 310 whereby data and control signals are communicated. The monitoring circuitry may then cause the signals to be ultimately output at input/output pin or terminal 306 (for example, via suitable bond pads 320, 312 and traces 328, 330). Exemplary implementations for the monitoring circuitry and associated methods are shown and described with reference to FIGS. 12A, 12B, and 13.

FIG. 12A is a schematic diagram of an exemplary implementation of a circuitry 400 for allowing the monitoring of signals between two integrated circuit (IC) chips in a single package, according to an embodiment of the invention. For example, these chips could be system chip 308 or memory chip 310 of MCM 300 or, alternatively, system IC 12 or memory 14 of semiconductor devices 10 and 50. In various embodiments, circuitry 400 may be provided on or implemented in any of such chips (i.e., system chip 308 or memory chip 310 of MCM 300, or system IC 12 or memory 14 of semiconductor devices 10 and 50). In the exemplary embodiment described herein, circuitry 400 is implemented in a memory chip 310 (or memory 14).

As depicted, circuitry 400 comprises bond pads 402 and 404. At least some of these bond pads 402, 404 may correspond to bond pads 320 in FIG. 11. Some of these bond pads 402 are used for communicating signals between memory chip 310 and system chip 308. These signals can be for data (DQ), address (A), clock (CLK), clock enable (CKE), chip select (CS), address (A), row address strobe (RAS), column address strobe (CAS), write enable (WE), data read/write mask (DQM), and bank select (BA). Such bond pads 402 may be connected to system chip 308 via, for example, bonding wires, other bond pads, and traces on a PCB substrate (e.g., bonding wire 316, bond pad 312, and trace 314 in FIG. 11). Other bond pads 404 can be used for communicating signals between memory chip 310 and external circuitry (e.g., test equipment). As shown, such signal can be for test data (TDQ). The bond pads 404 can be connected to terminals 306 of the packaged semiconductor device by, for example, bonding wire and traces (e.g., traces 330 and 328, and bonding wire 326).

Various buffer circuits may be connected to each bond pad 402 or 404. For each bond pad 402, these buffer circuits can include an input buffer 404 and a monitor buffer 406. For each bond pad 402 associated with a data (DQ) signal, an output buffer 408 may also be provided. Each input buffer 404 supports the input of a signal (e.g., data (DQ), chip select (CS), address (A), row address strobe (RAS), column address strobe (CAS), write enable (WE)) into the memory chip 310. Each output buffer 408 supports the output of a signal (e.g., data (DQ)) from memory chip 310. The input buffer 404 and output buffer 408 for a bond pad associated with a data (DQ) signal may correspond to the input/output buffer 322 shown in FIG. 11. Each monitor buffer 406 supports the monitoring of a signal that is communicated between memory chip 310 and system chip 308 within the packaged semiconductor device.

The monitor buffers 406 for various bond pads 402 may be connected with lines 430 in a "daisy chain" arrangement 410. In some embodiments, multiple daisy chain arrangements 410 are used for connecting groups of monitor buffers 406 or bond pads 402 in the packaged semiconductor device. For example, as shown, one daisy chain arrangement 410 connects the monitor buffers 406 for the bond pads 402 which are separately labeled "BP0," "BP1," "BP2," "BP3," . . . "BP7." Another daisy chain arrangement 410 connects the monitor buffers 406 for the bond pads 402 which are separately labeled "BPi," "Bpi+1," "Bpi+2," "Bpi+3," . . . "BPn−1."

With such daisy chain arrangement 410, the output of each monitor buffer 406 in the chain is provided as the input to next monitor buffer 406. Each monitor buffer 406 in a daisy chain arrangement 410 receives a respective select signal (e.g., SEL0, SEL1, SEL2, SEL3, . . . , SEL7). Only one select signal may be active at a given time. When active, the select signal causes the signal appearing at the bond pad 402 associated with the respective monitor buffer 406 to be output from the daisy chain at the output of the last monitor buffer 406 in the chain. This output from the daisy chain arrangement 410 may be taken and output from the packaged semiconductor device at a terminal 306 (FIG. 11). The daisy chain arrangement 410 thus allows the signal appearing at any bond pad 402 associated with one of the monitor buffers 406 in the chain to be monitored. An exemplary implementation for a monitor buffer 406 and daisy chain arrangement 410 is shown and described in more detail with reference to FIG. 13.

In one embodiment, each select signal (e.g., SEL0, SEL1, SEL2, SEL3, . . . , SEL7) can be generated by entering a respective combination of values for one or more test data (TDQ) signals (or alternatively, the address (A) signals) during test mode. In some embodiments, the SET and/or LOAD signals may be used in conjunction with the test data (TDQ) signals (or address (A) signals) for generating the select signals. An exemplary implementation for the generation of the SEL[0:7] signals is provided in the following table:

| Test Mode Name | P | SET | A7 TD7 | A6 TD6 | A5 TD5 | A4 TD4 | A3 TD3 | A2 TD2 | A1 TD1 | A0 TD0 |
|---|---|---|---|---|---|---|---|---|---|---|
| NOP | N | 1 | 1 | 1 | | | | 0 | 0 | 0 |
| VSEL0 | N | 1 | 1 | 1 | | | | 0 | 0 | 1 |
| VSEL1 | N | 1 | 1 | 1 | | | | 0 | 1 | 0 |
| VSEL2 | N | 1 | 1 | 1 | | | | 0 | 1 | 1 |
| VSEL3 | N | 1 | 1 | 1 | | | | 1 | 0 | 0 |
| VSEL4 | N | 1 | 1 | 1 | | | | 1 | 0 | 1 |
| VSEL5 | N | 1 | 1 | 1 | | | | 1 | 1 | 0 |
| VSEL6 | N | 1 | 1 | 1 | | | | 1 | 1 | 1 |
| NOP | N | 1 | 1 | 1 | 0 | 0 | 0 | | | |
| VSEL7 | N | 1 | 1 | 1 | 0 | 0 | 1 | | | |
| Reserve | N | 1 | 1 | 1 | 0 | 1 | 0 | | | |
| Reserve | N | 1 | 1 | 1 | 0 | 1 | 1 | | | |
| Reserve | N | 1 | 1 | 1 | 1 | 0 | 0 | | | |
| Reserve | N | 1 | 1 | 1 | 1 | 0 | 1 | | | |
| Reserve | N | 1 | 1 | 1 | 1 | 1 | 0 | | | |
| Reserve | N | 1 | 1 | 1 | 1 | 1 | 1 | | | |

Thus, for example, when SET=1 and TDQ[7:0]=11xxx001, the "interface mode" bit is active, and the SEL0 signal is generated.

In the implementation of circuitry 400, the output signals from the plurality of daisy chain arrangements 410 are multiplexed at a multiplexer 412. The output of the multiplexer 412 may be provided at bond pad 404 for communicating out of the packaged semiconductor device at a terminal 306 (see FIG. 11). As shown, such bond pad 404 may be associated with a test data (TDQ) signal. A test buffer 414 may be connected to bond pad 404 for communicating the test data (TDQ) signal. Such test buffer 414 may correspond to the test buffer 324 shown in FIG. 11. Such test buffer 414 can include a input buffer 416 for writing test data into memory chip 310, and an output latch 418 for reading test data from memory chip 310. A multiplexer 420 functions to multiplex the output test data (TDQ) with the monitored signals. A driver 422 drives the output signal at the bond pad 404.

The daisy chain arrangement 410 for the monitor buffers 406 provides a technical advantage. Specifically, a separate conductive or routing line (e.g., metallization layer 2 or "M2") extending from each monitor buffer 406 to some output bond pad 404 is not required to output each signal to be monitored. Instead, each monitored signal is passed along some portion (up to all) of lines 430 connecting monitor buffers 406 in the daisy chain arrangement 410 until the signal is ultimately output at the end of the daisy chain. This provides a savings in space and facilitates the layout for memory chip 310.

FIG. 12B is a schematic diagram of another exemplary implementation of a circuitry 450 for allowing the monitoring of signals between two integrated circuit chips in a single package, according to an embodiment of the invention. Such chips could be, for example, system chip 308 or memory chip 310 of MCM 300 or, alternatively, system IC 12 or memory 14 of semiconductor devices 10 and 50. As with circuitry 400 described above with reference to FIG. 12A, circuitry 450 may be provided on or implemented in any of such chips (i.e., system chip 308 or memory chip 310 of MCM 300, or system IC 12 or memory 14 of semiconductor devices 10 and 50). In the exemplary embodiment described herein, circuitry 450 is implemented in a memory chip 310 (or memory 14).

Circuitry 450 is substantially similar to circuitry 400 with one distinction. Rather than being multiplexed, the signals from the various daisy chain arrangements 410 are each output at a respective bond pad 404. Each such bond pad 404 may be connected to a separate I/O terminal 306 of the packaged semiconductor device (see FIG. 11). As shown, the bond pads 404 which are used can be the same as the ones for the test data (TDQ) signals. This allows a plurality of monitored signals to be communicated out of the memory chip 310 (or memory 14) simultaneously.

With this embodiment, each select signal (SEL[0:7]) is operable to select one signal from each daisy chain arrangement 410 to be output at a respective bond pad 404 (for a test data (TDQ) signal). The following table is an exemplary configuration.

| | TD7 | TD6 | TD5 | TD4 | TD3 | TD2 | TD1 | TD0 |
|---|---|---|---|---|---|---|---|---|
| SEL0 | BA0 | CKE | CLK | CLK\ | CS\ | WE\ | CAS\ | RAS\ |
| SEL1 | A1 | A3 | A5 | A7 | A8 | A6 | A4 | A2 |
| SEL2 | BA1 | A11 | A9 | A0 | X | X | A12 | A10 |
| SEL3 | DQ19 | DQ18 | DQ17 | DQ16 | DQ3 | DQ2 | DQ1 | DQ0 |

-continued

|  | TD7 | TD6 | TD5 | TD4 | TD3 | TD2 | TD1 | TD0 |
|---|---|---|---|---|---|---|---|---|
| SEL4 | DQ23 | DQ22 | DQ21 | DQ20 | DQ7 | DQ6 | DQ5 | DQ4 |
| SEL5 | DQ27 | DQ26 | DQ25 | DQ24 | DQ11 | DQ10 | DQ9 | DQ8 |
| SEL6 | DQ31 | DQ30 | DQ29 | DQ28 | DQ15 | DQ14 | DQ13 | DQ12 |
| SEL7 | DQS3 | DQS2 | DM3 | DM2 | DQS1 | DQS0 | DM1 | DM0 |

Thus, for example, referring to the embodiment shown in FIG. 12B and the table above, when the SEL0 signal has been generated or is active, the signal RAS at the bonding pad BP0 of the first daisy chain arrangement 410 is output at the bond pad 404 for test data signal TDQ0, the signal CAS at a bonding pad 402 of the next daisy chain arrangement 410 is output at the bond pad 404 for test data signal TDQ1, and so on, with the signal BA0 at the bonding pad BPi of the last daisy chain arrangement 410 being output at the bond pad for test data signal TDQ7. Similarly, for example, when the SEL1 signal has been generated or is active, the signal A2 at the bonding pad BP1 of the first daisy chain arrangement 410 is output at the bond pad 404 for test data signal TDQ0, the signal A4 at a bonding pad 402 of the next daisy chain arrangement 410 is output at the bond pad 404 for test data signal TDQ1, and so on, with the signal A1 at the bonding pad Bpi+1 of the last daisy chain arrangement 410 being output at the bond pad for test data signal TDQ7.

FIG. 13 is a schematic diagram of an exemplary implementation of a daisy chain arrangement 410 of monitor buffers 406, according to an embodiment of the invention. This daisy chain arrangement can be incorporated on an IC chip which is combined with and receives signals from another chip in the same package. Each monitor buffer 406 in the daisy chain arrangement 410 is provided for monitoring a different signal from the other chip.

As shown, each monitor buffer 406 has two input terminals (IN1 and IN2), a select terminal, and an output terminal (OUT). The monitor buffers 406 in the daisy chain are connected in sequence with the output terminal of any given monitor buffer 406 (except the last) being connected to the first input terminal (IN1) of the next monitor buffer 406 in the daisy chain. The output terminal for the last monitor buffer 406 in the daisy chain may be connected (directly or indirectly) to a bond pad for output from the chip on which daisy chain arrangement 410 is implemented. The first input terminal (IN1) for the first monitor buffer 406 in the daisy chain may be connected to a voltage source. The second input terminal of each monitor buffer 406 is connected to a bond pad at which a signal from the other chip is received. The select terminal of each monitor buffer 406 is connected to receive a respective signal (e.g., SEL0, SEL1, SEL2, . . . , SEL7) for selecting that monitor buffer 406.

Each monitor buffer 406 includes a buffer or driver 500, a NAND gate 502, and an inverter 504. Driver 500 is connected to receive a signal to be monitored at the input terminal connected to a respective bond pad. Driver 500 is enabled by a respective select signal (e.g., SEL0, SEL1, SEL2, . . . , SEL7). When SELx signal is LOW, the output of driver 500 is high, thus allowing the IN1 signal to go through. When the SELx signal is HIGH, the driver 500 is enabled. When enabled, driver 500 functions to drive the received signal.

NAND gate 502 receives the driven signal from driver 500 at one input terminal, and the output from a prior monitor buffer 406 at another input terminal. Inverter 504 receives and inverts the output from NAND gate 502. The output of inverter 504 is the output for the monitor buffer 406.

In operation, only one monitor buffer 406 in the daisy chain arrangement 410 is selected at a given time. In the monitor buffer 406 which is selected, the driver 500 drives the signal on the respective bond pad. For all other monitor buffers 406 in the chain, the drivers 500 are not enabled. NAND gate 502 in the selected monitor buffer 406 performs a NAND operation between the driven signal and the output from a monitor buffer 406 earlier in the chain. This allows the signal from the selected monitor buffer 406 to propagate or be relayed through the daisy chain arrangement until it is output from the end of the chain.

FIG. 14 is an exemplary timing diagram 500 for loading a test code during a cycle for the mode register set (MRS) commands, according to an embodiment of the invention. The MRS commands include chip select (CS), row address strobe (RAS), column address strobe (CAS), and write enable (WE). In one embodiment, the MRS command is defined with the SET signal going HIGH, and each of the CS, RAS, CAS, and WE signals going low. In this embodiment, synchronous operation (i.e., with a clock signal) is shown.

Referring to the timing diagram 500, the cycle for MRS command occurs at the leading edge of the second clock pulse. At this point, a test code can be loaded to, for example, memory chip 310 of MCM 300 or memory 14 of semiconductor devices 10 and 50, using the test data (TDQ) signals or address (A) signals. Such test code can be, for example, one for generating a select signal (e.g., SEL[0:7]) to select one or more signals to be monitored at the interface between two chips in the packaged semiconductor device. No operation occurs in the third clock cycle. Then, at the leading edge of the fourth clock pulse, the test mode is activated.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

The invention claimed is:

1. A method for monitoring signals communicated between a first integrated circuit chip and a second integrated circuit chip within a single packaged semiconductor device, the method comprising:

receiving signals from the first integrated circuit chip at a plurality of bond pads on the second integrated circuit chip;

selecting a portion of the received signals;

outputting from the second integrated chip the selected portion of the signals received from the first integrated circuit chip to outside the single packaged semiconductor device for monitoring of the signals of the first integrated circuit chip;

wherein the second integrated circuit chip comprises a plurality of monitor buffers connected in a daisy chain arrangement, each monitor buffer being individually selectable and associated with a respective one of the plurality of bond pads on the second integrated circuit chip;

wherein selecting comprises selecting one of the plurality of monitor buffers; and wherein outputting comprises outputting the signal received at the bond pad associated with the selected monitor buffer at the end of the daisy chain arrangement.

2. The method of claim 1 comprising placing the second integrated circuit chip into a test mode.

3. The method of claim 1 wherein performing testing of the first integrated circuit chip comprises measuring a standby current of the first integrated chip.

4. The method of claim 1 wherein selecting comprises generating a respective select signal.

5. The method of claim 1 wherein selecting comprises loading a respective test code into second integrated circuit chip.

6. The method of claim 5 wherein loading occurs during a cycle for a mode register set (MRS) command.

7. The method of claim 1 wherein one of the first and second integrated circuit chips comprises a logic device and wherein the other of the first and second integrated circuit chips comprises a memory device.

8. A method for monitoring signals communicated between a first integrated circuit chip and a second integrated circuit chip within a single packaged semiconductor device, wherein at least some external terminals for the packaged semiconductor device are shared by the first and second integrated circuit chips, wherein the second integrated circuit chip comprises a plurality of monitor buffers connected in daisy chain arrangement, each monitor buffer being individually selectable and associated with a respective bond pad on the second integrated circuit chip for receiving signals from the first integrated chip, the method comprising:

receiving signals from the first integrated circuit chip at the plurality of bond pads on the second integrated circuit chip;

selecting one of the monitor buffers in the daisy chain arrangement; and relaying the signal received at the bond pad associated with the selected monitor buffer through some portion of the daisy chain arrangement.

9. The method of claim 8 wherein the second integrated circuit chip is designed for a normal mode of operation and a test mode.

10. The method of claim 9 comprising transitioning the second integrated circuit chip from the normal mode of operation into the test mode.

11. The method of claim 8 comprising outputting the relayed signal at one of the shared external terminals for the packaged semiconductor device.

12. The method of claim 8 wherein selecting comprises loading a respective test code into second integrated circuit chip.

13. The method of claim 12 wherein loading occurs during a cycle for a mode register set (MRS) command.

14. The method of claim 8 wherein one of the first and second integrated circuit chips comprises a logic device and wherein the other of the first and second integrated circuit chips comprises a memory device.

15. A system comprising:

a first integrated circuit chip packaged in a semiconductor device;

a second integrated circuit chip packaged along with the first integrated circuit chip in the same semiconductor device;

wherein the second integrated circuit chip comprises monitoring circuitry for receiving signals sent from the first integrated circuit chip to the second integrated circuit chip, the monitoring circuitry for outputting the received signals to outside the single packaged semiconductor device for monitoring of the signals of the first integrated circuit chip; and wherein the monitoring circuitry comprises a plurality of monitor buffers connected in daisy chain arrangement, each monitor buffer being individually selectable and connected to a respective bond pad on the second integrated chip for receiving signals from the first integrated chip.

16. The system of claim 15 wherein the second integrated circuit chip comprises a memory device.

17. The system of claim 15 wherein one of the first and second integrated circuit chips comprises a logic device and wherein the other of the first and second integrated circuit chips comprises a memory device.

18. A first integrated circuit chip for packaging along with a second integrated circuit chip in a single packaged semiconductor device, the first integrated circuit chip comprising:

a plurality of bond pads at which signals can be received from the second integrated circuit chip; and a plurality of monitor buffers connected in a daisy chain arrangement, each monitor buffer being individually selectable and associated with a respective one of the plurality of bond pads, the daisy chain arrangement operable to relay the signal received at the bond pad associated with each monitor buffer through some portion of the daisy chain arrangement.

19. The first integrated circuit chip of claim 18 wherein each monitor buffer is separately selectable.

20. The first integrated circuit chip of claim 18 wherein a respective test code can be loaded into the first integrated circuit chip for selecting each monitor buffer.

21. The first integrated circuit chip of claim 18 each test code can be loaded during a cycle for a mode register set (MRS) command.

22. The first integrated circuit chip of claim 18 wherein at least some external terminals for the single packaged semiconductor device are shared by the first and second integrated circuit chips.

* * * * *